US009882484B2

United States Patent
Fukumoto

(10) Patent No.: US 9,882,484 B2
(45) Date of Patent: Jan. 30, 2018

(54) SWITCHING POWER SUPPLY DEVICE HAVING PULSE-BY-PULSE TYPE OVERCURRENT PROTECTION FUNCTION

(71) Applicant: ROHM CO., LTD., Kyoto (JP)

(72) Inventor: Yosuke Fukumoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 15/381,353

(22) Filed: Dec. 16, 2016

(65) Prior Publication Data
US 2017/0187289 A1 Jun. 29, 2017

(30) Foreign Application Priority Data

Dec. 25, 2015 (JP) ................................. 2015-254169

(51) Int. Cl.
*H02M 3/158* (2006.01)
*H02M 1/32* (2007.01)
*H02M 1/08* (2006.01)
*H03K 17/08* (2006.01)
*H02M 1/00* (2006.01)

(52) U.S. Cl.
CPC ............ *H02M 3/158* (2013.01); *H02M 1/08* (2013.01); *H02M 1/32* (2013.01); *H03K 17/08* (2013.01); *H02M 2001/0003* (2013.01); *H02M 2001/0009* (2013.01)

(58) Field of Classification Search
CPC ..................... H02M 1/08; H02M 1/32; H02M 3/155–3/1588; H02M 2001/0003; H02M 2001/0009; H02M 2001/0032; H02M 2001/0035

See application file for complete search history.

(56) References Cited

U.S. PATENT DOCUMENTS 7,109,692 B1 * 9/2006 Wu .................... H02M 1/44
323/282
7,541,795 B1 * 6/2009 Smith .................. H02M 1/32
323/283

(Continued)

FOREIGN PATENT DOCUMENTS

| JP | 2004-194452 | 7/2004 |
|---|---|---|
| JP | 2005-210845 | 8/2005 |
| JP | 2014-003850 | 1/2014 |

OTHER PUBLICATIONS

European Patent Office; Extended European Search Report dated Jul. 12, 2017 in European patent Application No. 16205114.8 (7 pages).

*Primary Examiner* — Yusef Ahmed
(74) *Attorney, Agent, or Firm* — Fish & Richardson P.C.

(57) ABSTRACT

A switching power supply device includes: a switching output circuit configured to generate an output voltage from an input voltage; an oscillation circuit configured to generate a clock signal; a control circuit configured to control driving of the switching output circuit in synchronization with the clock signal; a pulse-by-pulse type overcurrent protection circuit configured to detect an overcurrent flowing through the switching output circuit to generate an overcurrent protection signal for forcibly stopping a switching operation of the switching output circuit; and a pulse skip circuit configured to perform a pulse skip operation of the clock signal in response to the overcurrent protection signal.

5 Claims, 17 Drawing Sheets

(56) References Cited

U.S. PATENT DOCUMENTS

| | | | | |
|---|---|---|---|---|
| 7,868,595 B1* | 1/2011 | Smith | H02M 1/36 | 323/222 |
| 2005/0254184 A1* | 11/2005 | Fukui | H02H 7/1213 | 361/18 |
| 2006/0109039 A1* | 5/2006 | Wu | H02M 3/33507 | 327/172 |
| 2009/0102445 A1* | 4/2009 | Ito | H02M 3/156 | 323/283 |
| 2009/0128113 A1* | 5/2009 | Ryoo | G05F 1/618 | 323/283 |
| 2010/0008106 A1* | 1/2010 | Kawabe | H02M 3/33507 | 363/21.01 |
| 2010/0165683 A1* | 7/2010 | Sugawara | H02M 1/4225 | 363/126 |
| 2011/0057637 A1* | 3/2011 | Liu | H02M 3/156 | 323/287 |
| 2011/0089925 A1* | 4/2011 | Ishida | H02M 1/32 | 323/285 |
| 2011/0133711 A1* | 6/2011 | Murakami | H03K 17/0822 | 323/282 |
| 2011/0199145 A1* | 8/2011 | Kawai | H02M 3/156 | 327/419 |
| 2012/0049829 A1* | 3/2012 | Murakami | H02M 1/32 | 323/288 |
| 2014/0112035 A1* | 4/2014 | Shu | H02M 1/36 | 363/50 |
| 2014/0146238 A1* | 5/2014 | Murakami | H02M 3/1563 | 348/730 |
| 2014/0218988 A1* | 8/2014 | Hayashi | H02M 3/156 | 363/126 |
| 2014/0312684 A1* | 10/2014 | Sawada | H02M 3/33523 | 307/9.1 |
| 2015/0194971 A1* | 7/2015 | Tsai | H03L 7/085 | 327/142 |
| 2015/0229212 A1* | 8/2015 | Shiwaya | H02M 3/158 | 323/282 |
| 2016/0111868 A1* | 4/2016 | Kawata | H02H 3/10 | 361/79 |
| 2016/0141959 A1* | 5/2016 | Murakami | H02M 3/1588 | 323/271 |
| 2016/0172978 A1* | 6/2016 | Fukumoto | H02M 3/156 | 713/300 |
| 2016/0380539 A1* | 12/2016 | Fukumoto | H02M 3/158 | 323/271 |

* cited by examiner

SWITCHING POWER SUPPLY DEVICE HAVING PULSE-BY-PULSE TYPE OVERCURRENT PROTECTION FUNCTION

CROSS-REFERENCE TO RELATED APPLICATION(S)

This application is based upon and claims the benefit of priority from Japanese Patent Application No. 2015-254169, filed on Dec. 25, 2015, the entire contents of which are incorporated herein by reference.

TECHNICAL FIELD

The present disclosure relates to a switching power supply device.

BACKGROUND

Conventionally, most of switching power supply devices has an overcurrent protection circuit for forcibly stopping a switching operation of an output transistor when an overcurrent is detected. A typically used type of the overcurrent protection circuit is a pulse-by-pulse type in which a forcible-stop and self-return of a switching operation is repeated at every period.

However, sometimes an output fault (grounded output or the like) that an extremely large amount of overcurrent flows occurs, in the pulse-by-pulse type overcurrent protection circuit in which a forcible-stop and self-return (resume) of the switching operation is repeated. In this case, even though an ON time is shortened to a minimum at every switching period, limiting an overcurrent is still delayed. Thus, an inductor current is continually increased, leading to breakdown of a switching output circuit.

SUMMARY

The present disclosure provides some embodiments of a switching power supply device capable of enhancing a pulse-by-pulse type overcurrent protection function.

According to one embodiment of the present disclosure, there is provided a switching power supply device, including: a switching output circuit configured to generate an output voltage from an input voltage; an oscillation circuit configured to generate a clock signal; a control circuit configured to control driving of the switching output circuit in synchronization with the clock signal; a pulse-by-pulse type overcurrent protection circuit configured to detect an overcurrent flowing through the switching output circuit to generate an overcurrent protection signal for forcibly stopping a switching operation of the switching output circuit; and a pulse skip circuit configured to perform a pulse skip operation of the clock signal in response to the overcurrent protection signal (first configuration).

In the device having the first configuration, the pulse skip circuit may include: a frequency dividing part configured to start a frequency dividing operation of the clock signal in response to the overcurrent protection signal to generate a mask period expiration signal; an RS flipflop configured to generate a mask signal set to a first logic level in response to the overcurrent protection signal and reset to a second logic level in response to the mask period expiration signal; and a logic gate configured to block the clock signal over a mask period during which the mask signal is set to the first logic level (second configuration).

In the device having the first configuration, the pulse skip circuit may include: a timer part configured to start a counting operation in response to the overcurrent protection signal to generate a mask period expiration signal; an RS flipflop configured to generate a mask signal set to a first logic level in response to the overcurrent protection signal and reset to a second logic level in response to the mask period expiration signal; and a logic gate configured to block the clock signal over a mask period during which the mask signal is set to the first logic level (third configuration).

In the device having the first configuration, the pulse skip circuit may include: a timer part configured to start a counting operation in response to the clock signal to generate a mask period expiration signal; an RS flipflop configured to generate a first mask signal set to a first logic level in response to the overcurrent protection signal and reset to a second logic level in response to the mask period expiration signal; a D flipflop configured to latch the first mask signal in response to the overcurrent protection signal to generate a second mask signal; and a logic gate configured to block the clock signal over a mask period during which the second mask signal is set to the first logic level (fourth configuration).

In the device having the fourth configuration, the second mask signal may be reset to the second logic level in response to the mask period expiration signal (fifth configuration).

In the device having the third or fourth configuration, the timer part may be configured to extend the mask period as the output voltage is lowered (sixth configuration).

In the device having the third or fourth configuration, the timer part may include: a current source configured to generate a charge current; a capacitor charged by the charge current; a charge/discharge switch configured to conduct and block between both ends of the capacitor in response to the mask signal; a voltage source configured to generate a threshold voltage; and a comparator configured to compare a charge voltage of the capacitor with the threshold voltage to generate an expiration timing signal (seventh configuration).

In the device having the seventh configuration, the current source may be configured to decrease the charge current as the output voltage is lowered (eighth configuration).

In the device having the seventh or eighth configuration, the voltage source may be configured to increase the threshold voltage as the output voltage is lowered (ninth configuration).

According to another embodiment of the present disclosure, there is provided an electronic device including the switching power supply device having any one of the first to ninth configurations (tenth configuration).

DETAILED DESCRIPTION

<Switching Power Supply Device>

Figure 1:
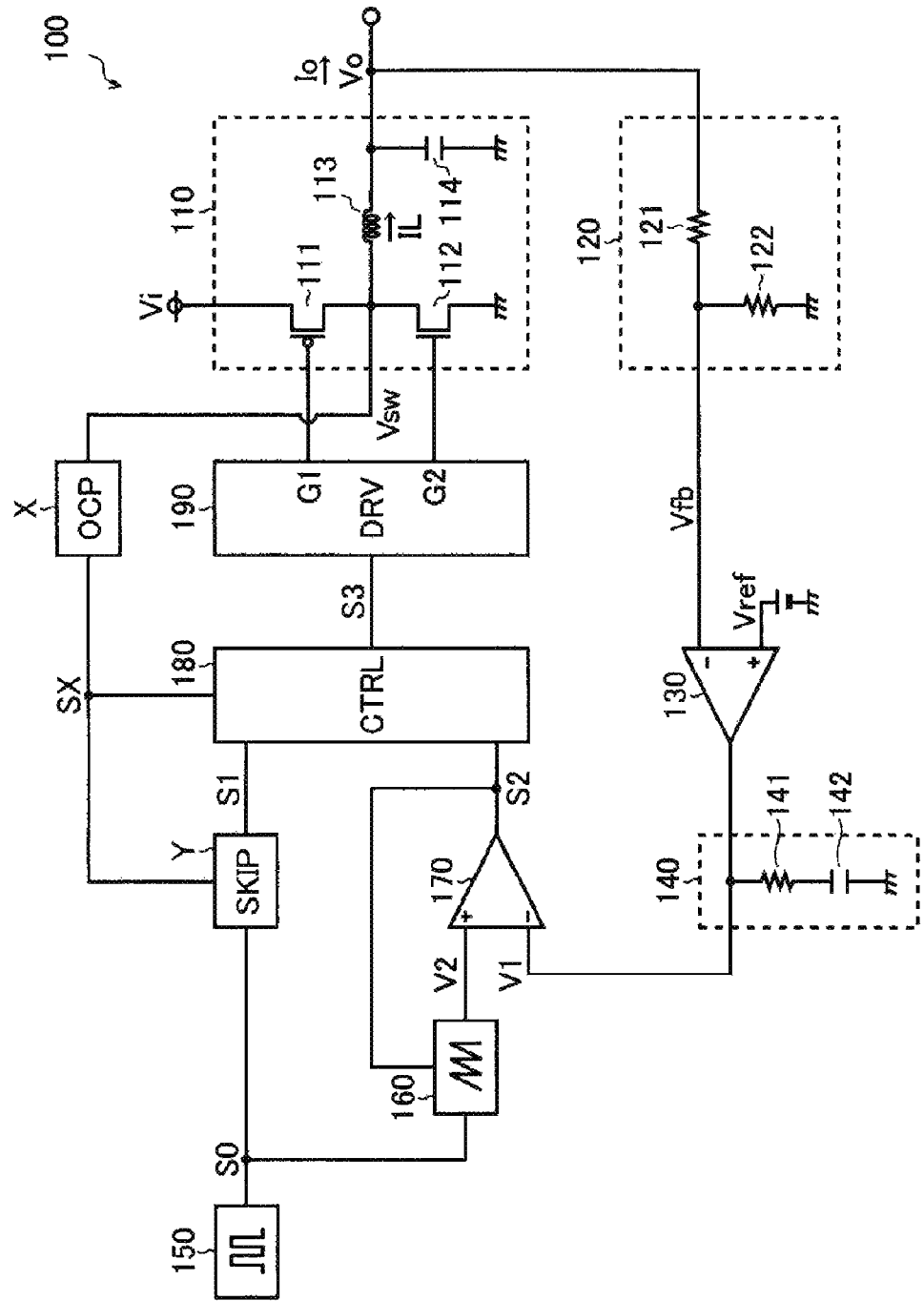
FIG. 1 is a block diagram illustrating an overall configuration of a switching power supply device.

FIG. 1 is block diagram illustrating an overall configuration of a switching power supply device. The switching power supply device 100 of this configuration example is a pulse width modulation (PWM) driven DC/DC converter for generating an output voltage Vo from an input voltage Vi and supplying the same to a load (a central processing unit (CPU) or the like) (not shown). The switching power supply device 100 includes a switching output circuit 110, a feedback voltage generating circuit 120, an error amplifier 130, a phase compensation filter 140, a clock signal generating circuit 150, a slope voltage generating circuit 160, a PWM comparator 170, a control circuit 180, a switch driving circuit 190, an overcurrent protection circuit X, and a pulse skip circuit Y. In addition, any protection circuit (an anti-low input malfunction circuit, a temperature protection circuit, and the like) other than the aforementioned circuit elements may also be incorporated in the switching power supply device 100.

The switching output circuit 110 is a step-down switching output stage that steps down an input voltage Vi to generate a desired output voltage Vo, and includes an output transistor 111, a synchronous rectification transistor 112, an output inductor 113, and an output capacitor 114.

The output transistor 111 is a P channel type metal oxide semiconductor field effect transistor (PMOSFET) serving as an upper switch of the switching output stage. A source of the output transistor 111 is connected to an application terminal of the input voltage Vi. A drain of the output transistor 111 is connected to a first terminal of the output inductor 113. A gate of the output transistor 111 is connected to an application terminal of an upper gate signal G1. The output transistor 111 is turned off when the upper gate signal G1 has a high level and turned on when the upper gate signal G1 has a low level.

The synchronous rectification transistor 112 is an N channel type MOSFET (NMOSFET) serving as a lower switch of the switching output stage. A source of the synchronous rectification transistor 112 is connected to a ground terminal (an application terminal of a ground voltage GND). A drain of the synchronous rectification transistor 112 is connected to the first terminal of the output inductor 113. A gate of the synchronous rectification transistor 112 is connected to an application terminal of the lower gate signal G2. The synchronous rectification transistor 112 is turned on when the lower gate signal G2 has a high level and turned off when the lower gate signal G2 has a low level.

The output transistor 111 and the synchronous rectification transistor 112 are complementarily turned on and off depending on the upper gate signal G1 and the lower gate signal G2. Through such ON/OFF operations, a switch voltage Vsw having a rectangular shape that is pulse-driven between the input voltage Vi and the ground voltage GND is generated in the first terminal of the output inductor 113. Further, the term "complementary" described above includes a case where a simultaneous OFF period (dead time) of the output transistor 111 and the synchronous rectification transistor 112 is provided, as well as a case where the ON/OFF states of both transistors are completely reversed.

The output inductor 113 and the output capacitor 114 form an LC filter for rectifying or smoothing the switch voltage Vsw to generate the output voltage Vo. The first terminal of the output inductor 113 is connected to an application terminal of the switch voltage Vsw. Both a second terminal of the output inductor 113 and a first terminal of the output capacitor 114 are connected to an application terminal of the output voltage Vo. A second terminal of the output capacitor 114 is connected to the ground terminal.

An output type of the switching output circuit 110 is not limited to the step-down type and may be any of a step-up type, a step-up/step-down type, and an inverting type. Also, a rectification scheme of the switching output circuit 110 is not limited to the synchronous rectification scheme and a diode rectification scheme using a rectification diode in place of the synchronous rectification transistor 112 may also be employed.

Further, when a high voltage is applied to the switching output circuit 110, a high breakdown voltage element such as a power MOSFET, an insulated gate bipolar transistor (IGBR), an SiC transistor, and the like may be used as the output transistor 111 and the synchronous rectification transistor 112.

The feedback voltage generating circuit 120 includes resistors 121 and 122 connected in series between the application terminal of the output voltage Vo and the ground terminal, and outputs a feedback voltage Vfb (a divided voltage of the output voltage Vo) depending on the output voltage Vo at a connection node between the both resistors. Further, when the output voltage Vo is within an input dynamic range of the error amplifier 130, the feedback voltage generating circuit 120 may be omitted and the output voltage Vo may be directly input to the error amplifier 130.

The error amplifier 130 generates an error voltage V1 corresponding to a difference between the feedback voltage Vfb applied to an inverting input terminal (−) and a reference voltage Vref applied to a non-inverting input terminal (+). The error voltage V1 is increased when the feedback voltage Vfb is lower than the reference voltage Vref, and is decreased when the feedback voltage Vfb is higher than the reference voltage Vref.

The phase compensation filter 140 includes a resistor 141 and a capacitor 142 connected in series between an application terminal of the error voltage V1 and the ground terminal. The phase compensation filter 140 compensates for a phase of the error voltage V1 to prevent oscillation of the error amplifier 130.

The clock signal generating circuit 150 generates a clock signal S0 that is pulse-driven at a predetermined switching frequency fsw (=1/T).

Upon receipt of the clock signal S0 and an OFF signal S2, the slope voltage generating circuit 160 generates a slope voltage V2 having a triangular wave, a sawtooth wave, or an n order slope wave (e.g., n=2). The slope voltage V2 starts to rise in response to a falling edge of the clock signal S0, and is reset to a zero value in response to a rising edge of the OFF signal S2.

Further, an offset voltage obtained by simulating an inductor current IL (or an output current Io obtained by averaging the inductor current IL) flowing through the output inductor 113 may be added to the slope voltage V2. By employing such a configuration, it becomes possible to realize a current mode control, increasing load responsiveness.

The PWM comparator 170 compares the error voltage V1 applied to an inverting input terminal (−) and the slope voltage V2 applied to a non-inverting input terminal (+) to generate the OFF signal S2. The OFF signal S2 has a low level when the slope voltage V2 is lower than the error voltage V1 and has a high level when the slope voltage V2 is higher than the error voltage V1.

The control circuit 180 generates a pulse width modulation (PWM) signal S3 based on an ON signal S1 and the OFF signal S2. The PWM signal S3 is set to a high level at a falling edge of the ON signal S1 and reset to a low level at a rising edge of the OFF signal S2. Further, the control circuit 180 also has a function of forcibly stopping a switching operation of the switching output circuit 110 in response to an overcurrent protection signal SX.

Upon receipt of the PWM signal S3, the switch driving circuit 190 generates an upper gate signal G1 and a lower gate signal G2 (equivalent to a driving signal of the switching output circuit 110). The upper gate signal G1 and the lower gate signal G2 basically have a low level when the PWM signal S3 has a high level, and has a high level when the PWM signal S3 has a low level.

The overcurrent protection circuit X monitors the switch voltage Vsw and generates the overcurrent protection circuit SX indicating whether the inductor current IL flowing through the output inductor 113 is in an overcurrent state.

The pulse skip circuit Y performs a pulse skip operation on the clock signal S0 in response to the overcurrent protection signal SX, to generate the ON signal S1.

<PWM Control>

Figure 2:
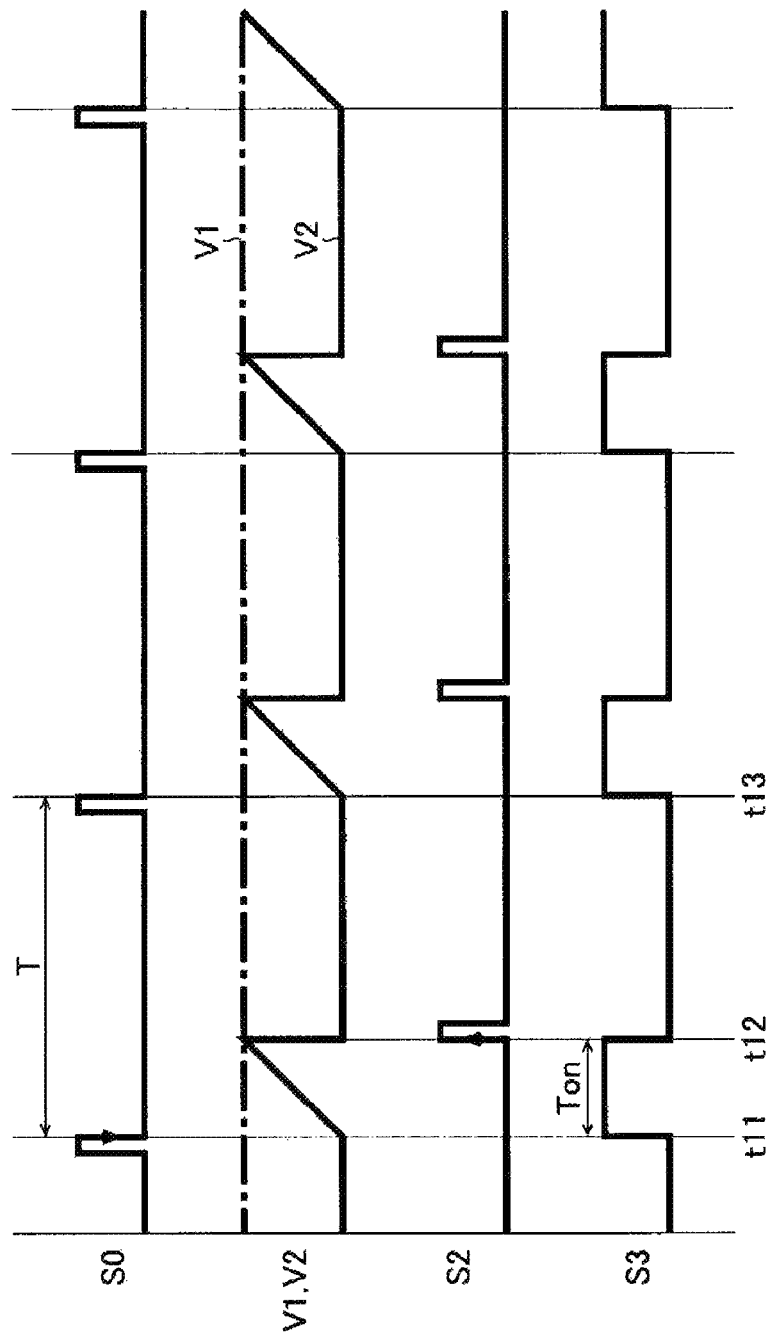
FIG. 2 is a timing chart illustrating a basic operation of controlling pulse width modulation.

FIG. 2 is a timing chart illustrating a basic operation of controlling pulse width modulation, in which the clock signal S0 (i.e., ON signal S1), the error voltage V1 and the slope voltage V2, the OFF signal S2, and the PWM signal S3 are illustrated in order from above. In this drawing, a behavior in a state where an overcurrent is not detected (which is a state where a pulse skip operation is not performed on the clock signal S0).

At time t11, when the clock signal S0 falls to a low level, the PWM signal S3 is set to a high level. As a result, the output transistor 111 of the switching output circuit 110 is turned on and the synchronous rectification transistor 112 is turned off. Further, at the time t11, when the clock signal S0 falls to a low level, the slope voltage V2 starts to rise with a predetermined slope.

At time t12, when the slope voltage V2 is higher than the error voltage V1 so that the OFF signal S2 rises to a high level, the PWM signal W3 is reset to a low level. As a result, the output transistor 111 of the switching output circuit 110 is turned off and the synchronous rectification transistor 112 is turned on. Further, at the time t12, when the OFF signal S2 rises to a high level, the slope voltage V2 is rapidly discharged.

Through the above-described PWM control, a high level period Ton (an ON period of the output transistor 111) of the PWM signal S3 is lengthened as the error voltage V1 is higher, and shortened as the error voltage V1 is lower. In other words, the duty D (=Ton×1/T) of the PWM signal S3 is increased as the error voltage V1 is higher, and shortened as the error voltage V1 is lower.

Further, even after time t13 at which the clock signal S0 falls again to a low level, the PWM control is repeated, so that the output transistor 111 and the synchronous rectification transistor 112 of the switching output circuit 110 are periodically turned on and off to generate a desired output voltage Vo.

<Overcurrent Protection Circuit>

Figure 3:
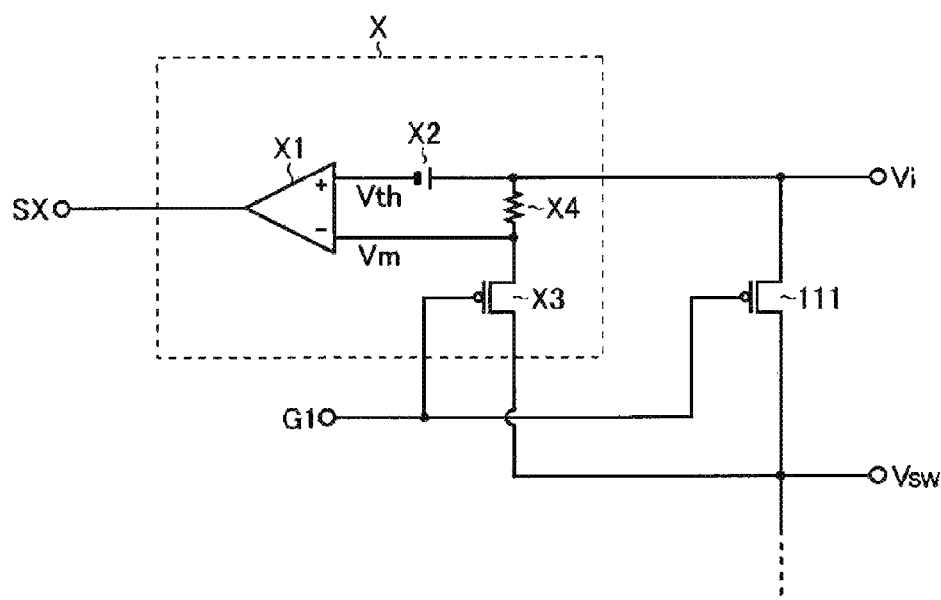
FIG. 3 is a circuit diagram illustrating a configuration example of an overcurrent protection circuit.

FIG. 3 is a circuit diagram illustrating a configuration example of the overcurrent protection circuit X. The overcurrent protection circuit X of this configuration example includes an OCP comparator X1, a voltage source X2, a P channel type MOSFET X3, and a resistor X4.

Both a positive terminal of the voltage source X2 and a first terminal of the resistor X4 are connected to an application terminal of an input voltage Vi. A negative terminal of the voltage source X2 as an application terminal of a threshold voltage Vth (<Vi) is connected to a non-inverting input terminal (+) of the OCP comparator X1. A second terminal of the resistor X4 is connected to each of an inverting input terminal (−) of the OCP comparator X1 and a source of the transistor X3. A drain of the transistor X3 is connected to an application terminal of the switch voltage Vsw. A gate of the transistor X3 is connected to an application terminal of the upper gate signal G1.

In the overcurrent protection circuit X having this configuration, the transistor X3 is turned off during a high level period of the upper gate signal G1, and turned on during a low level period of the upper gate signal G1. In other words, the transistor X3 is turned on and off in synchronization with the output transistor 111. Thus, a monitor voltage Vm applied to the inverting input terminal (−) of the OCP comparator X1 is equal to the high level of the switch voltage Vsw when the output transistor 111 is turned on, and is pulled up to the input voltage Vin through the resistor X4 when the output transistor 111 is turned off.

Further, the monitor voltage Vm obtained when the output transistor 111 is turned on has a voltage value obtained by subtracting a voltage across the output transistor 111 from the input voltage Vi (=Vi−I×Ron) (where I is an upper current flowing through the output transistor 111 and Ron is an ON resistance of output transistor 111). In other words, when the ON resistance Ron of the output transistor 111 is regarded as a predetermined value, the monitor voltage Vm obtained when the output transistor 111 is turned on is lowered as the upper current I is increased.

Thus, it may be detected whether the upper current I flowing through the output transistor 111 (further, the inductor current IL flowing through the output inductor 113) is in an overcurrent state by comparing the monitor voltage Vim with the threshold voltage Vth by the OCP comparator X1.

More specifically, the overcurrent protection signal SX has a high level (i.e., a logic level when an overcurrent is detected) when the monitor voltage Vm is lower than the threshold voltage Vth, and has a low level (a logic level when an overcurrent is not detected) when the monitor voltage Vm is higher than the threshold voltage Vth. In other words, the overcurrent protection signal SX has a high level when the inductor current IL is greater than a threshold current Ith (=(Vi−Vth)/Ron), and has a low level when the inductor current IL is smaller than the threshold current Ith.

In the configuration of generating the overcurrent protection signal SX by monitoring the switch voltage Vsw in this manner, it is not necessary to insert a sense resistor in the current path through which the inductor current IL flows, reducing the cost and enhancing the output efficiency.

<Overcurrent Protection Operation (Basis)>

Hereinafter, an overcurrent protection operation when the pulse skip circuit Y is not introduced (i.e., when the clock signal S0 is directly input as the ON signal S1 to the control circuit 180) will be first described with reference to FIGS. 4 and 5 in order to clarify the purpose of introducing the pulse skip circuit Y.

Figure 4:
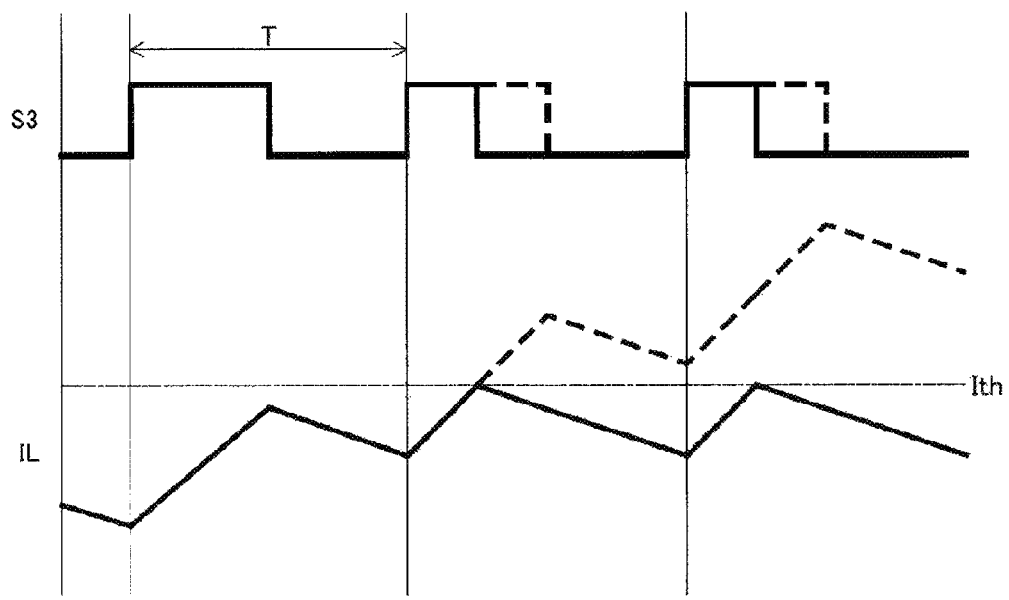
FIG. 4 is a timing chart illustrating an example of an overcurrent protection operation.

FIG. 4 is a timing chart illustrating an example of an overcurrent protection operation, in which the PWM signal S3 and the inductor current IL (the solid line: overcurrent protection, the broken line: no overcurrent protection) are illustrated in order from above.

In the overcurrent protection operation of FIG. 4, when the inductor current IL is greater than the predetermined threshold current Ith, the PWM signal S3 forcibly falls to a low level. As a result, since a switching operation of the switching output circuit 110 is forcibly stopped, a peak value of the inductor current IL is limited not to exceed the threshold current Ith.

In particular, in the pulse-by-pulse type overcurrent protection operation, a forcible-stop and self-return of the switching operation is repeated at every switching period T. That is to say, even though an overcurrent is detected during a certain period so that the switching operation of the switching output circuit 110 is forcibly stopped, the switching operation is self-returned (resumed) at a next period. Thus, even when the overcurrent protection is temporarily applied due to a variation in a load or the like, an output operation may be resumed.

Figure 5:
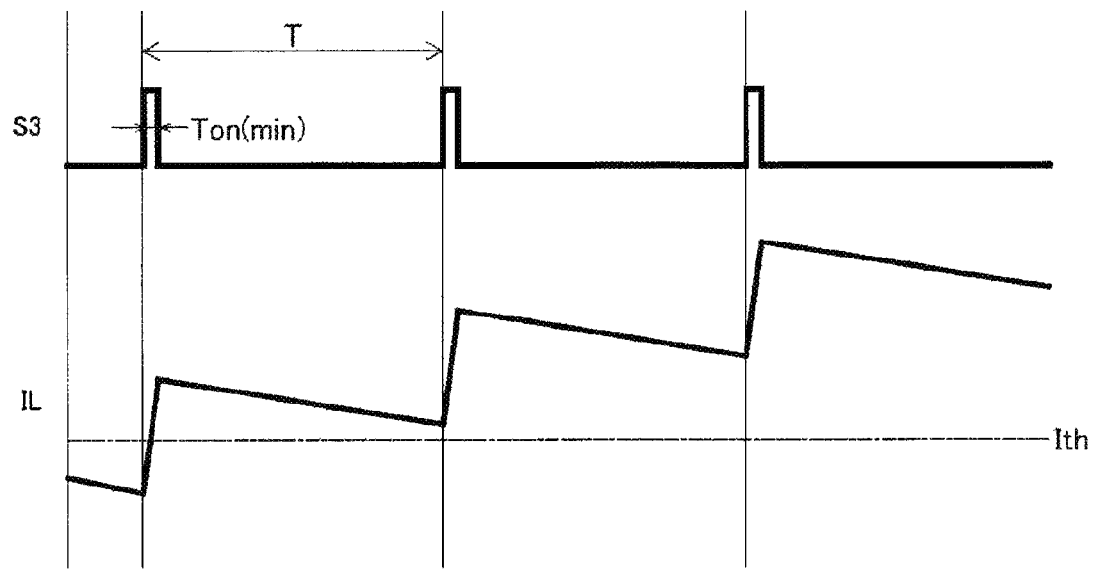
FIG. 5 is a timing chart illustrating a problem of an overcurrent protection operation.

FIG. 5 is a timing chart illustrating a problem of an overcurrent protection operation, in which the PWM signal S3 and the inductor current IL are illustrated in order from above. In FIG. 5, for example, a behavior when the output terminal of the output voltage Vo is grounded through a path of low impedance in an application in which the input voltage Vi is high is illustrated.

When the output is grounded, in the pulse-by-pulse type overcurrent protection operation in which forcible-stop and self-return (resume) of the switching operation is repeated, even though the ON time Ton is shortened to a minimum (i.e., minimum ON period Ton (min)) at every switching period T, limiting the overcurrent (i.e., reducing the inductor current IL during a forcible OFF period) may be delayed to cause the inductor current IL to be continuously increased, leading to breakdown of the switching output circuit 110.

As one approach to enhance the overcurrent protection function, shortening the minimum ON period Ton (min) by minimizing a signal delay of the OCP comparator X1 is considered. However, in order to reduce the signal delay of the OCP comparator X1, it is necessary to increase a driving current, which is disadvantageous in promoting the power saving of the switching power supply device 100. In addition, no matter how the driving current of the OCP comparator X1 is increased, it is impossible to completely make the signal delay zero. Thus, minimizing the signal delay is not a basic solution of the problem.

Thus, in the switching power supply device 100, the pulse skip circuit Y is introduced as a solution to the problem. Hereinafter, various embodiments of a configuration and an operation of the pulse skip circuit Y will be described in detail as an example.

Pulse Skip Circuit (First Embodiment)

Figure 6:
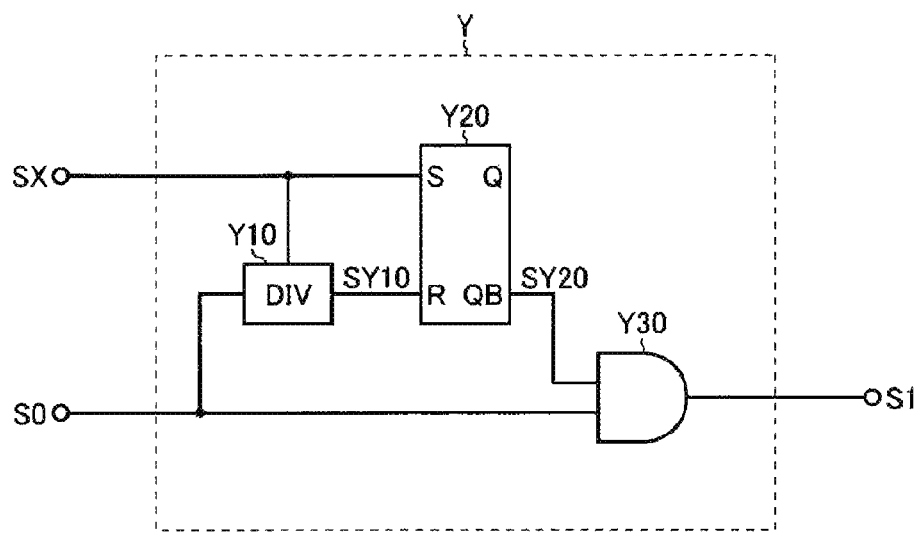
FIG. 6 is a circuit diagram illustrating a first embodiment of a pulse skip circuit.

FIG. 6 is a circuit diagram illustrating a first embodiment of the pulse skip circuit Y. The pulse skip circuit Y of this embodiment includes a frequency dividing part Y10, an RS flipflop Y20, and an AND gate Y30.

The frequency dividing part Y10 starts a frequency dividing operation of the clock signal S0 in response to the overcurrent protection signal SX to generate a mask period expiration signal SY10 for determining an expiration timing of a mask period Tm.

The RS flipflop Y20 outputs a mask signal SY20 from an inverting output terminal based on the overcurrent protection signal SX input to a set terminal and the mask period expiration signal SY10 input to a reset terminal. For example, the RS flipflop Y20 sets the mask signal SY20 to a low level in response to a rising edge of the overcurrent protection signal SX and resets the mask signal SY20 to a high level in response to a rising edge of the mask period expiration signal SY10.

The AND gate Y30 performs a logical AND operation on the clock signal S0 and the mask signal SY20 to generate the ON signal S1. When the mask signal SY20 has a high level, the clock signal S0 is through-output as the ON signal S1. Meanwhile, when the mask signal SY20 has a low level, the ON signal S1 is fixed to a low level, without relying on a logic level of the clock signal S0. In other words, the AND gate Y30 blocks the clock signal S0 during a low level period (i.e., mask period Tm) of the mask signal SY20.

Figure 7:
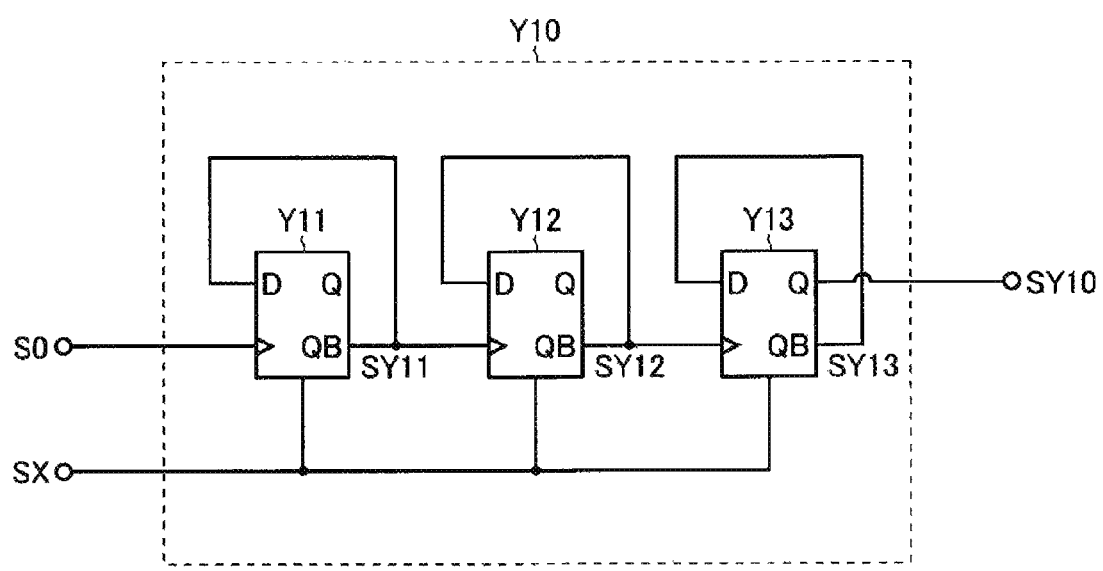
FIG. 7 is a circuit diagram illustrating a configuration example of a frequency dividing part.

FIG. 7 is a circuit diagram illustrating a configuration example of the frequency dividing part Y10. The frequency dividing part Y10 of the present configuration example includes D flipflops Y11 to Y13.

A clock terminal of the D flipflop Y11 is connected to an application terminal of the clock signal S0. An inverting output terminal of the D flipflop Y11 is connected to a data terminal of the D flipflop Y11. A reset terminal of the D flipflop Y11 is connected to an application terminal of the overcurrent protection signal SX. A frequency division clock signal SY11 output from the inverting output terminal of the D flipflop Y11 is for example a two-level signal (e.g., ½ frequency division signal of the clock signal S0) which is reset to a high level in response to a rising edge of the overcurrent protection signal SX and subsequently alternately changed in a logic level at every rising edge of the clock signal S0.

A clock terminal of the D flipflop Y12 is connected to an application terminal of the frequency division clock signal SY11. An inverting output terminal of the D flipflop Y12 is connected to a data terminal of the D flipflop Y12. A reset terminal of the D flipflop Y12 is connected to an application terminal of the overcurrent protection signal SX. A frequency division clock signal SY12 output from the inverting output terminal of the D flipflop Y12 is for example a two-level signal (e.g., ¼ frequency division signal of the clock signal S0) which is reset to a high level in response to a rising edge of the overcurrent protection signal SX and subsequently alternately changed in a logic level at every rising edge of the frequency division clock signal SY11.

A clock terminal of the D flipflop Y13 is connected to an application terminal of the frequency division clock signal SY12. An inverting output terminal of the D flipflop Y13 is connected to a data terminal of the D flipflop Y13. A reset terminal of the D flipflop Y13 is connected to an application terminal of the overcurrent protection signal SX. A frequency division clock signal SY13 output from the inverting output terminal of the D flipflop Y13 is for example a two-level signal (e.g., ⅛ frequency division signal of the clock signal S0) which is reset to a high level in response to a rising edge of the overcurrent protection signal SX and subsequently alternately changed in its logic level at every rising edge of the frequency division clock signal SY12.

Further, an output terminal of the D flipflop Y13 corresponds to an output terminal of the mask period expiration signal SY10. In other words, the mask period expiration signal SY10 is a two-level signal which falls to a low level in response to a rising edge of the overcurrent protection signal SX and rises to a high level in response to a rising edge of the frequency division clock signal SY12.

Figure 8:
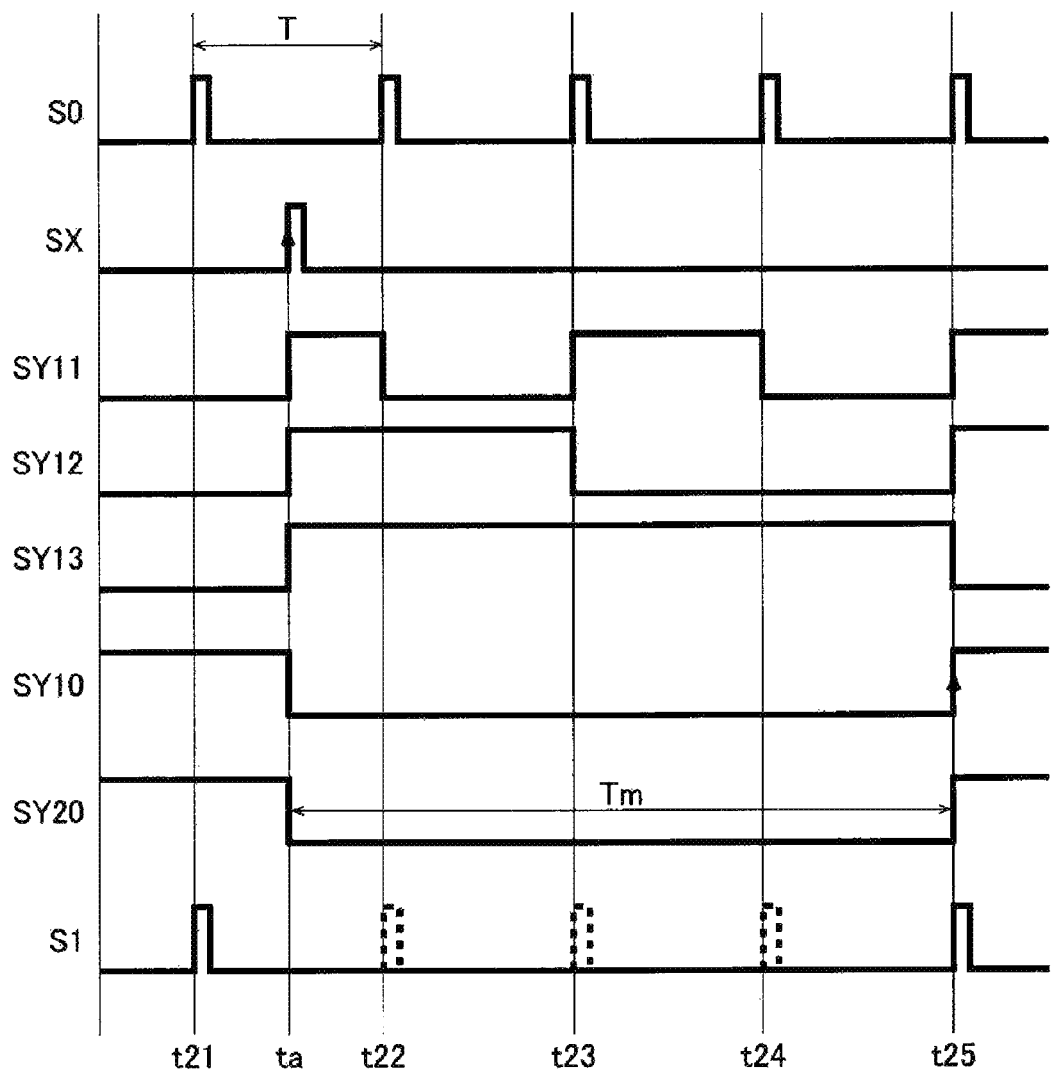
FIG. 8 is a timing chart illustrating an example of a pulse skip operation.

FIG. 8 is a timing chart illustrating an example of the pulse skip operation, in which the clock signal S0, the overcurrent protection signal SX, the frequency division clock signals SY11 to SY13, the mask period expiration signal SY10, the mask signal SY20, and the ON signal S1 are illustrated in order from above. Further, times t21 to t25 indicate pulse generation timings of the clock signal S0, and an interval therebetween is a switching period T.

A case where the output transistor 111 is turned on at the time t21 and the overcurrent protection signal SX subsequently rises to a high level at the time ta (i.e., a case where an overcurrent is detected) is now considered. In this case, in the RS flipflop Y20, the mask signal SY20 is set to a low level in response to a rising edge of the overcurrent protection signal SX. Thus, after the time ta, the ON signal S1 is fixed to a low level during a low level period (i.e., mask period Tm) of the mask signal SY20.

Further, in the frequency dividing part Y10, all the D flipflops Y11 to Y13 are reset in response to the rising edge of the overcurrent protection signal SX. Thus, all the frequency division clock signals SY11 to SY13 rise to a high level and the mask period expiration signal SY10 falls to a low level.

Thereafter, the frequency division clock signal SY11 is alternately changed in its logic level at every rising edge of the clock signal S0. In other words, the frequency division clock signal SY11 falls to a low level at the time t22, rises to a high level at the time t23, falls to a low level at the time t24, and rises to a high level at the time t25.

The frequency division clock signal SY12 is alternately changed in its logic level at every rising edge of the frequency division clock signal SY11. In other words, the frequency division clock signal SY12 falls to a low level at the time t23 and rises to a high level at the time t25.

Each of the frequency division clock signal SY13 and the mask period expiration signal SY10 is alternately changed in its logic level at every rising edge of the frequency division clock signal SY12. In other words, at the time t25 at which the frequency division clock signal SY12 rises to a high level, the frequency division clock signal SY13 falls to a low level and the mask period expiration signal SY10 rises to a high level.

As a result, in the RS flipflop Y20, the mask signal SY20 is reset to a high level in response to the rising edge of the mask period expiration signal SY10. Thus, after the time t25, the process is returned to a state where the clock signal S0 is through-output as the ON signal S1.

Through the series of pulse skip operations, three pulses of the clock signal S0 are skipped during the mask period Tm from the time to to the time t25.

Further, as mentioned above, in the frequency dividing part Y10, an operation of frequency-dividing the clock signal S0 always starts from an initial state (SY11=SY12=SY13=H, SY10=L) in response to the rising edge of the overcurrent protection signal SX. Thus, no matter at which timing an overcurrent is detected, the mask period Tm may be within a range of 3×T<Tm<4×T. Therefore, the operation of skipping pulses of the clock signal S0 may be appropriately performed.

Further, the pulse skip number is not limited to "3" and, for example, the number of stages of the flipflops of the frequency dividing part Y10 may be reduced and the pulse skip number may be "1" or "2". Conversely, the number of stages of the flipflops of the dividing part Y10 may be increased and the pulse skip number may be "4 or greater".

Figure 9:
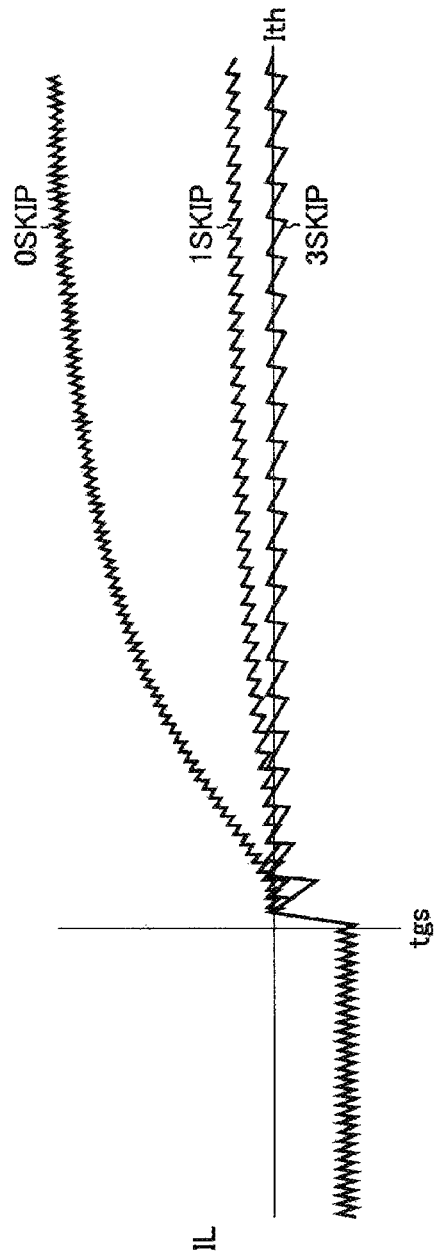
FIG. 9 is a view illustrating a comparison between behaviors of inductor currents in response to the presence and absence of a pulse skip operation.

FIG. 9 is a view illustrating a comparison between behaviors of inductor currents IL in response to the presence and absence of a pulse skip operation. In FIG. 9, the solid line 0SKIP indicates an inductor current when the pulse skip number is "0", the solid line 1SKIP indicates an inductor current when the pulse skip number is "1", and the solid line 3SKIP indicates an inductor current when the pulse skip number is "3".

When the output terminal of the output voltage Vo is grounded through a path of low impedance at time tgs, the inductor current IL hops and an overcurrent protection operation is applied. Here, when the pulse skip operation is not performed (the solid line 0SKIP), limiting the overcurrent is delayed to cause the inductor current IL to be continuously increased as illustrated in FIG. 5.

Meanwhile, when the pulse skip operation is performed (the solid line 1SKIP or the solid line 3SKIP), the ON frequency of the output transistor 111 may be reduced and a forcible stop period of a switching operation may be lengthened, enhancing the pulse-by-pulse type overcurrent protection function.

As the pulse skip number increases, the overcurrent protection function may be enhanced, while a ripple component of the inductor current IL is increased. Thus, in some embodiments, the pulse skip number may be set to a minimum number (e.g., "3") as long as the peak value of the inductor current IL may be limited to the threshold current Ith or less.

However, in the pulse skip circuit Y of this embodiment, the pulse skip operation is always performed when an overcurrent is detected. Thus, it should be noted that, at the time of transition from a normal operation to the overcurrent protection operation, a rapid decrease in the inductor current IL (further, the output current Io supplied to a load) may easily occur to cause a defective operation of a load (see the solid line 3 SKIP near the time tgs).

Pulse Skip Circuit (Second Embodiment)

Figure 10:
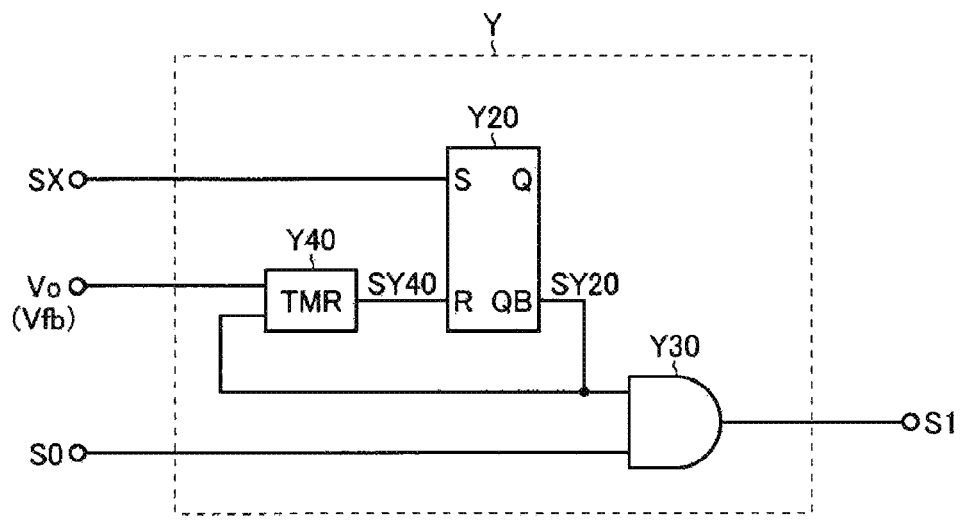
FIG. 10 is a circuit diagram illustrating a second embodiment of a pulse skip circuit.

FIG. 10 is a circuit diagram illustrating a second embodiment of the pulse skip circuit Y. The pulse skip circuit Y of this embodiment is based on the first embodiment (FIG. 6), but includes a timer part Y40 instead of the frequency dividing part Y10. Thus, the same components as those of the first embodiment will be given the same reference numerals as those of FIG. 6, and a redundant description thereof will be omitted and characteristic parts of the second embodiment will be mainly described hereinafter.

The timer part Y40 starts a counting operation in response to a falling edge of a mask signal SY20 (further, a rising edge of the overcurrent protection signal SX) to generate a mask period expiration signal SY40 for determining an expiration timing of the mask period Tm. The mask period expiration signal SY40 is input to the reset terminal of the RS flipflop Y20. Further, the timer part Y40 has a function of extending the mask period Tm as the output voltage Vo (or the feedback voltage Vfb) is lowered.

Figure 11:
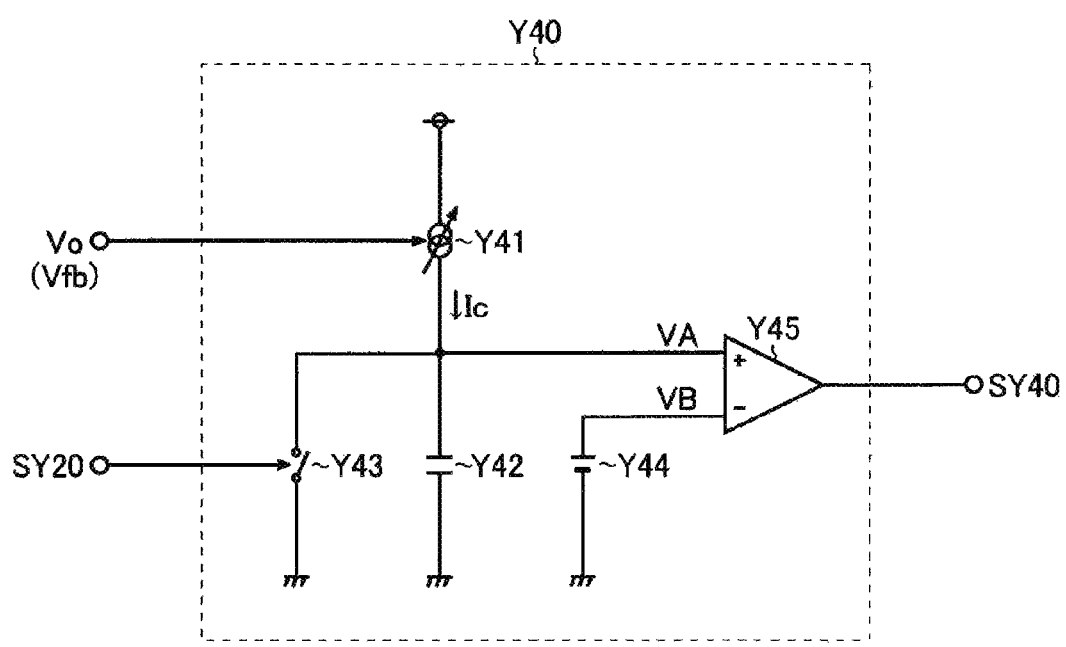
FIG. 11 is a circuit diagram illustrating a configuration example of a timer part.

FIG. 11 is a circuit diagram illustrating a configuration example of the timer part Y40. The timer part Y40 of the present configuration example includes a current source Y41, a capacitor Y42, a charge/discharge switch Y43, a voltage source Y44, and a comparator Y45.

The current source Y41 generates a variable charge current Ic according to the output voltage Vo (or the feedback voltage Vfb). More specifically, the current source Y41 reduces the charge current Ic as the output voltage Vo is lowered, and increases the charge current Ic as the output voltage Vo is increased.

A first terminal of the capacitor Y42 is connected to an output terminal of the current source Y41. A second terminal of the capacitor Y42 is connected to a ground terminal. When the charge/discharge switch Y43 is in an OFF state, the capacitor Y42 is charged by the charge current Ic and a charge voltage VA appearing at the first terminal of the capacitor Y42 is increased. Meanwhile, when the charge/discharge switch Y43 is in an ON state, the capacitor Y42 is discharged through the charge/discharge switch Y43 and the charge voltage VA is lowered.

The charge/discharge switch Y43 is a switch element for switching charging and discharging of the capacitor Y42 by conducting/blocking both ends of the capacitor Y42 in response to the mask signal SY20. The charge/discharge switch Y43 is turned on during a high level period (i.e., non-mask period) of the mask signal SY20 and turned off during a low level period (i.e., mask period) of the mask signal SY20.

The voltage source Y44 generates a predetermined threshold voltage VB.

The comparator Y45 compares the charge voltage VA input to a non-inverting input terminal (+) and the threshold voltage VB input to an inverting input terminal (−) to generate the mask period expiration signal SV40. The mask period expiration signal SV40 has a high level when the charge voltage VA is higher than the threshold voltage VB and has a low level when the charge voltage VA is lower than the threshold voltage VB.

Next, a pulse skip operation of the second embodiment will be described by two separate cases where the output voltage Vo is relatively high (hereinafter, referred to as "a high output time") and where the output voltage Vo is relatively low (hereinafter, referred to as "a low output time").

Figure 12:
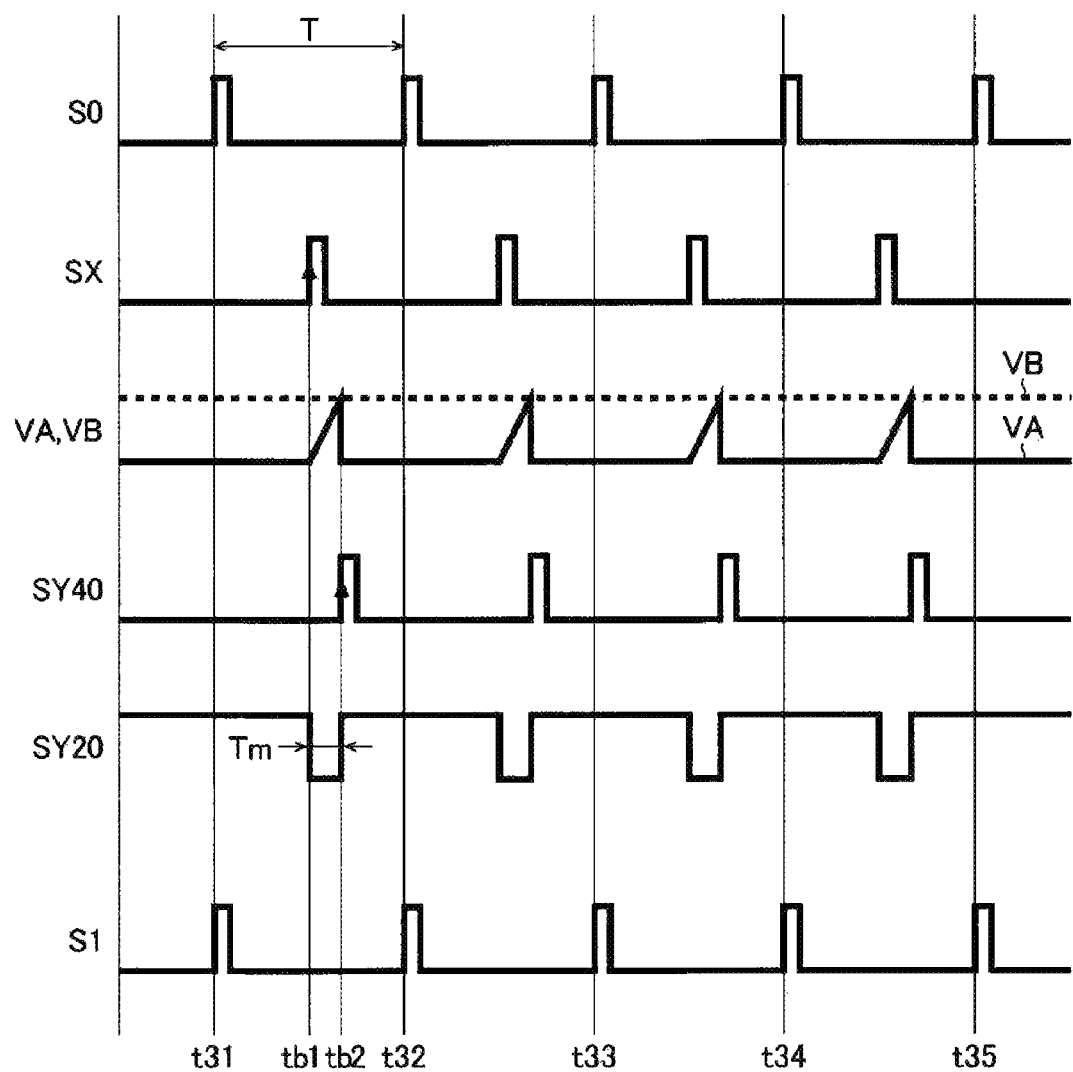
FIG. 12 is a timing chart illustrating a pulse skip operation in a high output time.

FIG. 12 is a timing chart illustrating a pulse skip operation (the pulse skip number is "0") in a high output time, in which the clock signal S0, the overcurrent protection signal SX, the charge voltage VA and the threshold voltage VB, the mask period expiration signal SV40, the mask signal SY20, and the ON signal S1 are illustrated in order from above. Further, times t31 to t35 indicate pulse generation timings of the clock signal S0, and an interval therebetween is a switching period T.

A case where the output transistor 111 is turned on at the time t31 and the overcurrent protection signal SX subsequently rises to a high level (i.e., a case where an overcurrent is detected) at the time tb1 is now considered. In this case, in the RS flipflop Y20, the mask signal SY20 is set to a low level in response to the rising edge of the overcurrent protection signal SX.

At this time, in the timer part Y40, the charge/discharge switch Y43 is turned off and the charge voltage VA starts to be increased. Also, the charge voltage VA is rapidly increased because the output voltage Vo is high. For example, when the output voltage Vo is kept near a target value thereof at the time of detecting an overcurrent, the charge voltage VA exceeds the threshold voltage VB and the mask period expiration signal SY40 rises to a high level at time tb2 earlier than the time t32 (i.e., a pulse generation timing of the clock signal S0 at a next period), as illustrated in FIG. 12.

As a result, in the RS flipflop Y20, the mask signal SY20 is reset to a high level in response to the rising edge of the mask period expiration signal SY40. Further, even after the time t32, the aforementioned operation is repeated basically unless the output voltage Vo is changed.

In this manner, in FIG. 12, once the mask signal SY20 falls to a low level upon detection of an overcurrent but rises to a high level again before a next pulse of the clock signal S0 is generated. Thus, since a pulse of the clock signal S0 does not arrive during the low level period (i.e., mask period Tm) of the mask signal SY20, the pulse skip number is "0". In other words, the same overcurrent protection operation as that of the existing case where forcible stop and self-return (resume) of the switching operation are repeated at every switching period T is performed.

Figure 13:
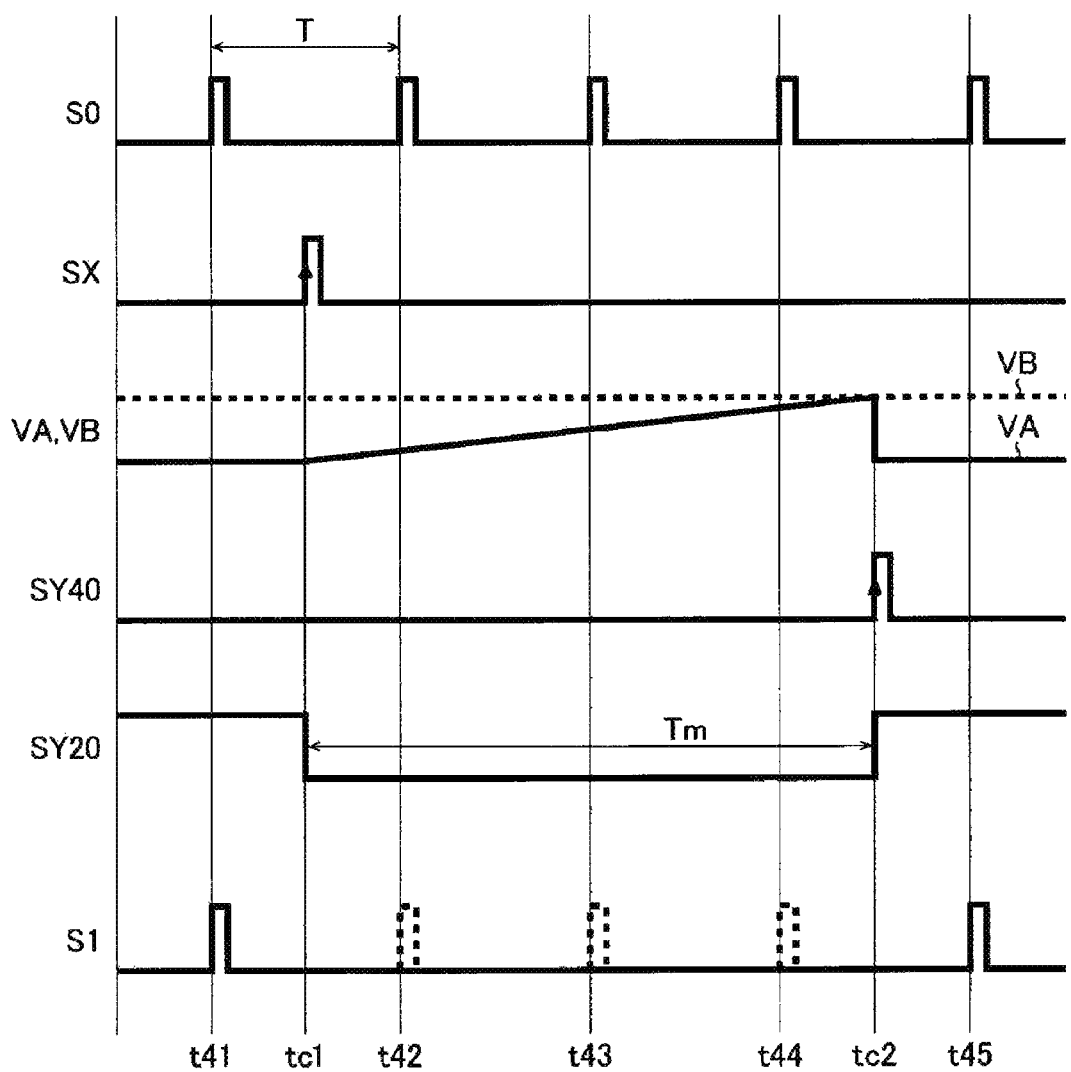
FIG. 13 is a timing chart illustrating a pulse skip operation in a low output time.

FIG. 13 is a timing chart illustrating a pulse skip operation (pulse skip number is "3") in a low output time. Similar to FIG. 12, the clock signal S0, the overcurrent protection signal SX, the charge voltage VA and the threshold voltage VB, the mask period expiration signal SY40, the mask signal SY20, and the ON signal S1 are illustrated in order from above. Further, times t41 to t45 indicate pulse generation timings of the clock signal S0, and an interval therebetween is a switching period T.

A case where the output transistor 111 is turned on at the time t41 and the overcurrent protection signal SX subsequently rises to a high level (i.e., a case where an overcurrent is detected) at the time tc1 is now considered. In this case, in the RS flipflop Y20, the mask signal SY20 is set to a low level in response to the rising edge of the overcurrent protection signal SX. Thus, after the time tc1, the ON signal S1 is fixed to a low level during a low level period (i.e., mask period Tm) of the mask signal SY20.

At this time, in the timer part Y40, the charge/discharge switch Y43 is turned off and the charge voltage VA starts to be increased. Also, the charge voltage VA is gently increased because the output voltage Vo is low. For example, when the output voltage Vo is lowered from its target value at the time of detecting an overcurrent, the charge voltage VA does not exceed the threshold voltage VB even when the time t42 arrives (i.e., a pulse generation timing of the clock signal S0 at a next period), as illustrated in FIG. 13. Thus, the mask period expiration signal SY40 does not rise to a high level but is kept in the low level.

Thereafter, the charge voltage VA continues to be gently increased and finally exceeds the threshold voltage VB at the time tc2 (later than a time t44 and earlier than the time t45). As a result, since the mask period expiration signal SY40 rises to a high level, the mask signal SY20 is reset to a high level. Thus, after the time tc2, the process is returned to a state where the clock signal S0 is through-output as the ON signal S1.

Through the series of pulse skip operations, three pulses of the clock signal S0 are skipped during the mask period Tm from the time tc1 to the time tc2. When the output voltage Vo is further increased, the charge current Ic may be further increased and the mask period Tm may be shortened, so that the pulse skip number may be set to a value smaller than "3". Conversely, when the output voltage Vo is further lowered, the charge current Ic may be further decreased and the mask period Tm may be lengthened, so that the pulse skip number may be set to a value greater than "3".

Figure 14:
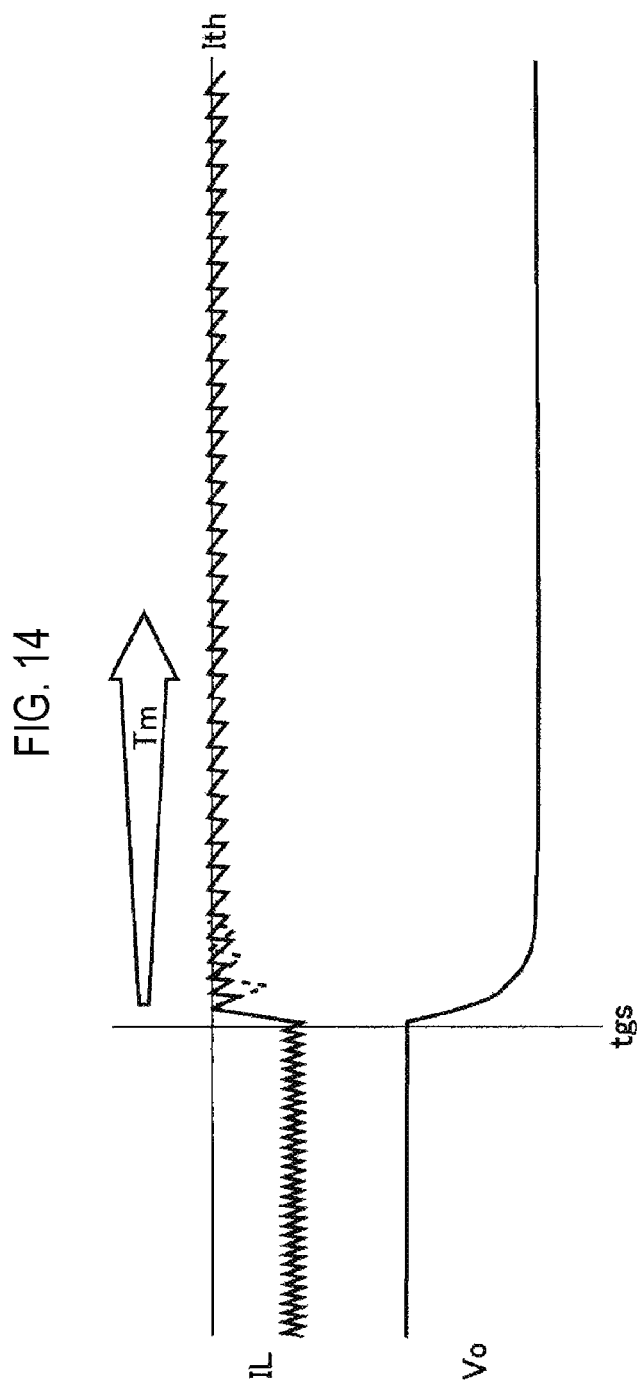
FIG. 14 is a waveform diagram illustrating a change behavior of a mask period in response to an output voltage.

FIG. 14 is a waveform diagram illustrating a change behavior of the mask period Tm in response to the output voltage Vo. When the output terminal of the output voltage Vo is grounded through a path of low impedance at the time tgs, the inductor current IL hops to apply an overcurrent protection operation. Thus, after the time tgs, the output voltage Vo is lowered with the lapse of time, and accordingly, the mask period Tm is gradually lengthened.

For example, since the output voltage Vo is not much lowered immediately after the time tgs, the pulse skip number is "0", which is a state where a pulse skip operation has not been performed (see FIG. 12 above). Thus, even when a normal operation transitions to an overcurrent protection operation, the inductor current IL (further, the output current Io supplied to a load) is not rapidly lowered, making it difficult to cause a defective operation of the load (see a comparison between the solid line and the broken line of the inductor current IL in FIG. 14).

Thereafter, the output voltage Vo is lowered with the lapse of time and the pulse skip number is increased to "1", "2", and "3" as the mask period Tm is lengthened. In this state, a pulse skip operation is performed (see FIG. 13). Thus, since an ON frequency of the output transistor 111 may be reduced and a forcible stop period of a switching operation may be lengthened, it is possible to enhance the pulse-by-pulse type overcurrent protection function.

Further, as a method for enhancing the pulse-by-pulse type overcurrent protection function, a configuration in which the switching frequency fsw itself is lowered as the output voltage Vo is lowered is also considered. In this configuration, however, since an output ripple component is increased even in an operation start time with the low output voltage Vo as well as in the overcurrent protection operation, a countermeasure is required. Meanwhile, in this configuration, the mask period Tm for pulse skipping is simply changed depending on the output voltage Vo when an overcurrent protection operation is applied. Thus, a problem of the operation start time does not arise.

Figure 15:
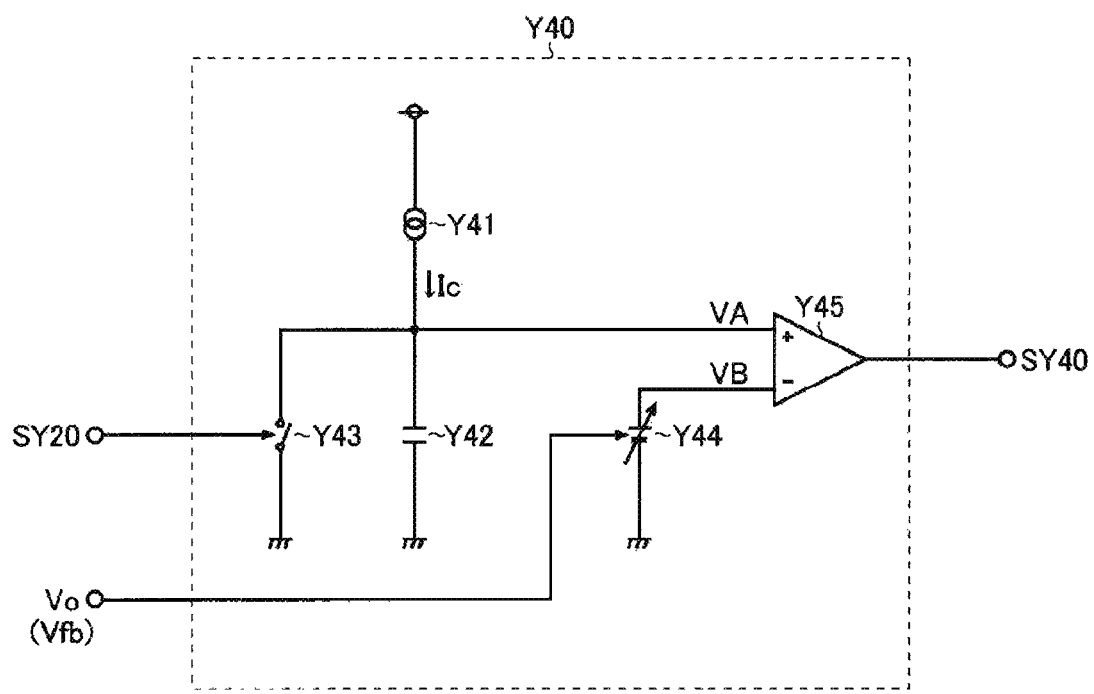
FIG. 15 is a circuit diagram illustrating a modification of a timer part.

FIG. 15 is a circuit diagram illustrating a modification of the timer part Y40. The timer part Y40 of this modification basically has the same configuration as that of FIG. 11, and features that the charge current Ic generated in a current source Y41 is a fixed value and the threshold voltage VB generated in a voltage source Y44 is a variable value. More specifically, the voltage source Y44 increases the threshold voltage VB as the output voltage Vo is lowered, and decreases the threshold voltage VB as the output voltage Vo is increased.

Also when this modification is employed, a timing at which the charge voltage VA and the threshold voltage VB cross each other (i.e., a timing at which the mask period expiration signal SV40 rises) becomes earlier as the output voltage Vo is increased and delayed as the output voltage Vo is lowered. Thus, like the example illustrated in FIG. 11, the mask period Tm may be shortened as the output voltage Vo is increased and lengthened as the output voltage Vo is lowered.

Further, as illustrated in FIGS. 11 and 15, by using an analog timer as the timer part Y40, it becomes possible to arbitrarily set the mask period Tm without using a clock for a high speed timer faster than the clock signal S0. However, when a clock for a high speed timer is separately provided, a digital timer may also be used as the timer part Y40.

Figure 16:
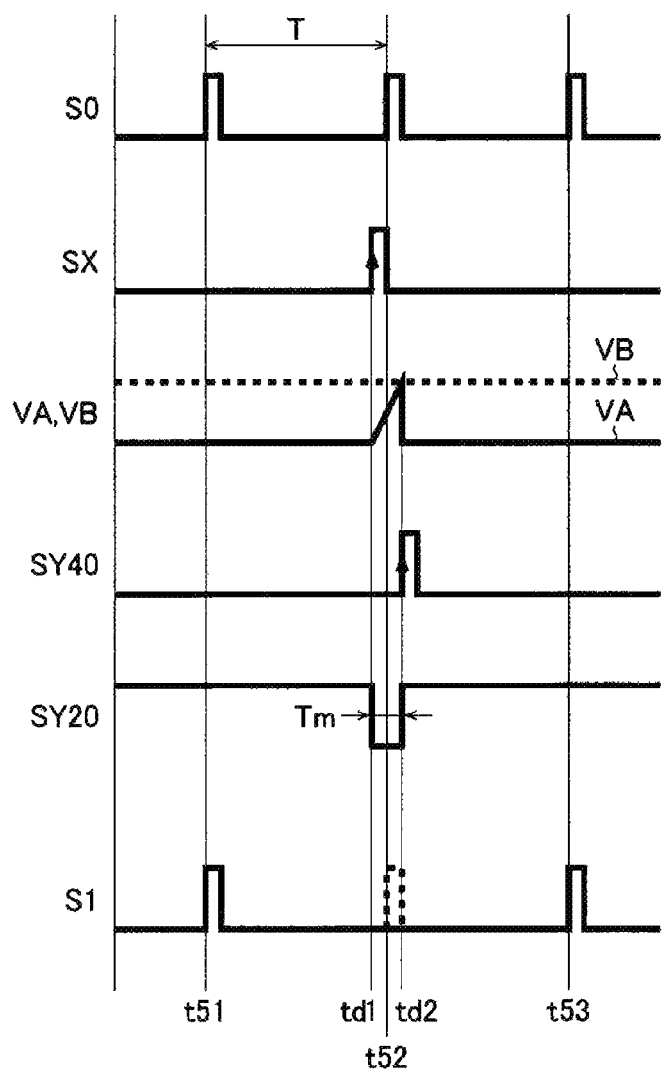
FIG. 16 is a timing chart illustrating an unintended pulse skip operation at the time of a high output.

FIG. 16 is a timing chart illustrating a problem (i.e., an unintended pulse skip operation in the high output time) when the second embodiment is employed. Similar to FIGS. 12 and 13, the clock signal S0, the overcurrent protection signal SX, the charge voltage VA and the threshold voltage VB, the mask period expiration signal SV40, the mask signal SY20, and the ON signal S1 are illustrated in order from above. Further, times t51 to t53 indicate pulse generation timings of the clock signal S0, and an interval therebetween is a switching period T.

A case where the output transistor 111 is turned on at the time t51 and the overcurrent protection signal SX is subsequently increased to a high level (i.e., a case where an overcurrent is detected) at the time td1 is now considered. In this case, in the RS flipflop Y20, the mask signal SY20 is set to a low level in response to the rising edge of the overcurrent protection signal SX.

At this time, in the timer part Y40, the charge/discharge switch Y43 is turned off and the charge voltage VA starts to be increased. Further, when the output voltage Vo is kept near its target value at the time of detecting an overcurrent, the mask period Tm expires almost instantly. Thus, a pulse skip operation is originally not performed (see FIG. 12 above).

However, when the time td1 is immediately before the time t52, namely, when a timing at which an overcurrent is detected is immediately before a timing at which a pulse of the clock signal S0 is generated at a next period, a situation in which the charge voltage VA does not exceed the threshold voltage VB or a situation in which the charge voltage VA exceeds the threshold voltage VB but the mask period expiration signal SY40 does not rise to a high level due to a signal delay of the comparator Y45 or the like may occur at the time t52.

In this situation, at the time t52 in which a pulse of the clock signal S0 is generated, the mask signal SY20 is kept at a low level, and thereafter, at the time td2 in which the mask period expiration signal SY40 rises to a high level, the mask signal SY20 is reset to a high level. In other words, the pulse of the clock signal S0 generated at the time t52 is unintentionally masked. Thus, an output ripple component may be increased and the inductor current IL (further, the output current Io) may be rapidly lowered.

In this manner, in the second embodiment, extremely rarely, a pulse skip operation which is not to be performed originally may be performed unintentionally. Hereinafter, a third embodiment capable of resolving the problem is proposed.

Pulse Skip Circuit (Third Embodiment)

Figure 17:
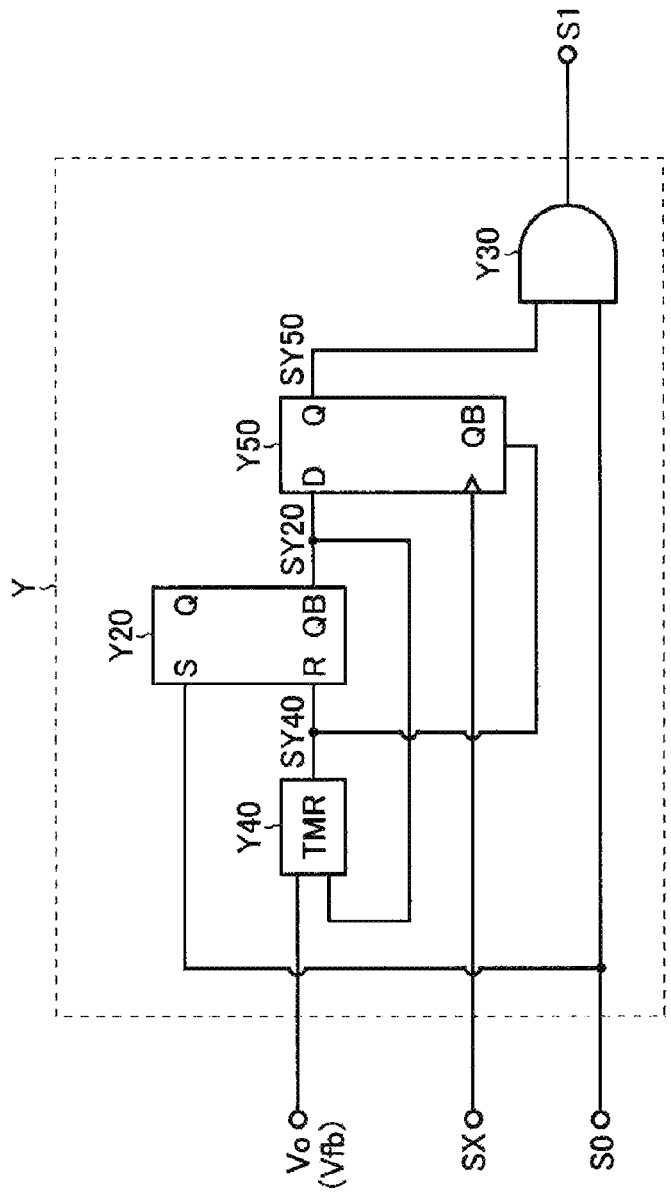
FIG. 17 is a circuit diagram illustrating a third embodiment of a pulse skip circuit.

FIG. 17 is a circuit diagram illustrating a third embodiment of the pulse skip circuit. The pulse skip circuit Y of this embodiment is based on the second embodiment (FIG. 10) and features that a D flipflop Y50 is added and connection of each part is changed. Thus, the same components as those of the second embodiment will be given the same reference numerals as those of FIG. 10, and a redundant description thereof will be omitted and characteristic parts of the third embodiment will be mainly described hereinafter.

A clock terminal of the D flipflop Y50 is connected to an application terminal of the overcurrent protection signal SX. A data terminal of the D flipflop Y50 is connected to an application terminal of the mask signal SY20, i.e., the inverting output terminal of the RS flipflop Y20. An output terminal of the D flipflop Y50 is an output terminal of a second mask signal SY50 and connected to an input terminal of an AND gate Y30. A reset terminal of the D flipflop Y50 is connected to an application terminal of the mask period expiration signal SV40, i.e., output terminal of the timer part Y40.

In response to the overcurrent protection signal SX, the D flipflop Y50 connected in this manner latches the mask signal SY20 to generate the second mask signal SY50. For example, when the overcurrent protection signal SX rises to a high level, if the mask signal SY20 has a high level, the second mask signal SY50 also has a high level. Meanwhile, when the overcurrent protection signal SX rises to a high level, if the mask signal SY20 has a low level, the second mask signal SY50 also has a low level. Further, the second mask signal SY50 is reset to a low level in response to, for example, a rising edge of the mask period expiration signal SV40.

According to the addition of the D flipflop Y50, a set terminal of the RS flipflop Y20 is connected to an application terminal of the clock signal S0, rather than to the application terminal of the overcurrent protection signal SX. In other words, the mask signal SY20 generated in the RS flipflop Y20 is set to a low level in response to a rising edge of the clock signal S0 and is reset to a high level in response to a rising edge of the mask period expiration signal SV40.

Also, according to the addition of the D flipflop Y50, the second mask signal SY50, rather than the mask signal SY20, is input to an AND gate Y30. In other words, the AND gate Y30 performs a logical AND operation on the clock signal S0 and the second mask signal SY50 to generate an ON signal S1. When the second mask signal SY50 has a high level, the clock signal S0 is through-output as the ON signal S1. Meanwhile, when the second mask signal SY50 has a low level, the ON signal S1 is fixed to a low level, without relying on a logic level of the clock signal S0. In other words, the AND gate Y30 blocks the clock signal S0 during a low level period (i.e., mask period Tm) of the second mask signal SY50.

Regarding the timer part Y40, a circuit configuration or a connection relation thereof is not particularly changed. However, as mentioned above, according to the addition of the D flipflop Y50, the mask signal SY20 input from the RS flipflop Y20 is set to a low level in response to a rising edge of the clock signal S0, rather than in response to a rising edge of the overcurrent protection signal SX. Thus, the timer part Y40 starts a counting operation in response to the rising edge of the clock signal S0, rather than in response to the rising edge of the overcurrent protection signal SX.

Next, a pulse skip operation of the third embodiment will be described by two separate cases where the output voltage Vo is relatively high (hereinafter, referred to as "at a high output time") and when the output voltage Io is relatively low (hereinafter, referred to as "at a low output time").

Figure 18:
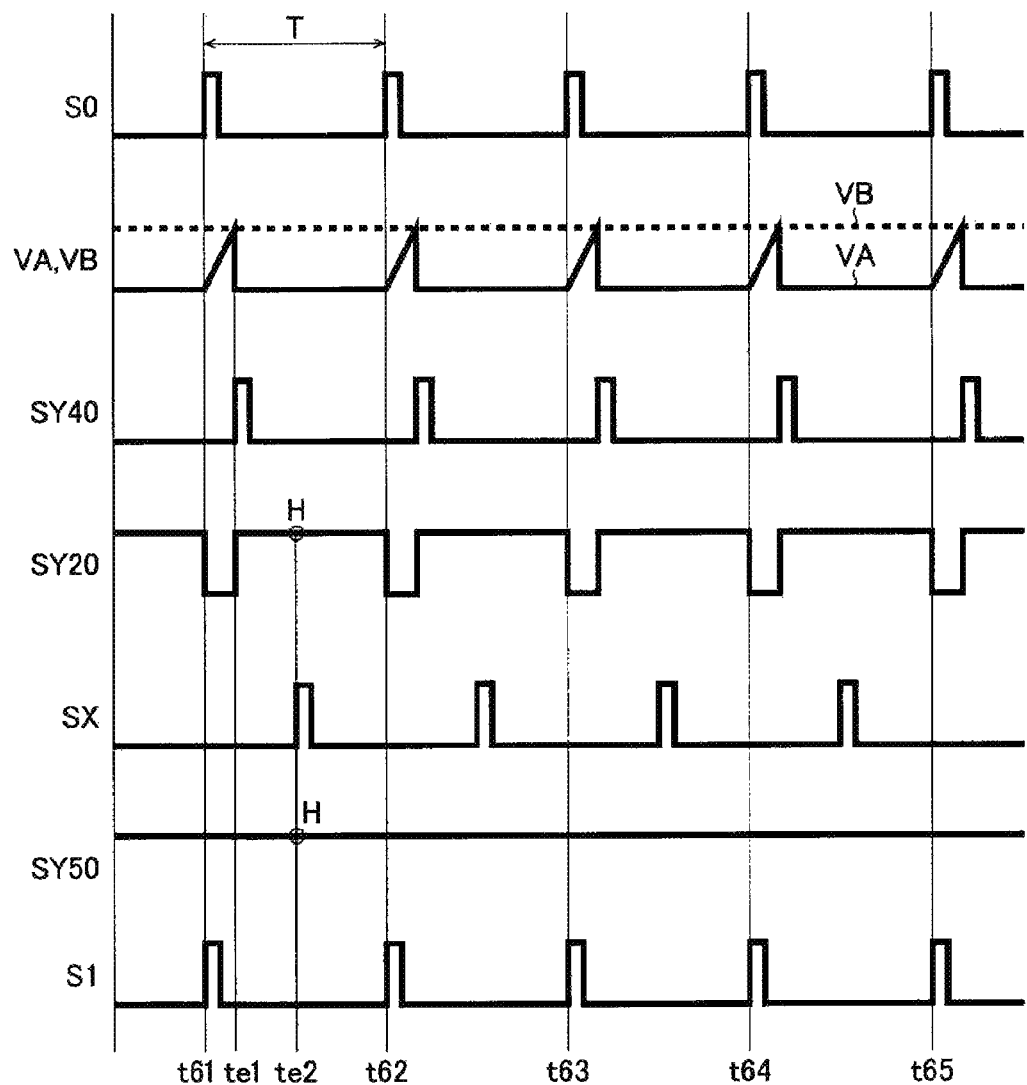
FIG. 18 is a timing chart illustrating a pulse skip operation in a high output time.

FIG. 18 is a timing chart illustrating a pulse skip operation (the pulse skip number is "0") at a high output time, in which the clock signal S0, the charge voltage VA and the threshold voltage VB, the mask period expiration signal SY40, the mask signal SY20, the overcurrent protection signal SX, the second mask signal SY50, and the ON signal S1 are illustrated in order from above. Further, times t61 to t65 indicate pulse generation timings of the clock signal S0, and an interval therebetween is a switching period T.

A case where the output transistor 111 is turned on at the time t61 and the overcurrent protection signal SX subsequently rises to a high level (i.e., a case where an overcurrent is detected) at the time te2 is now considered. In this case, the mask signal SY20 is first set to a low level in response to the rising edge of the clock signal S0 at the time t61.

At this time, in the timer part Y40, the charge/discharge switch Y43 is turned off and the charge voltage VA starts to be increased. Also, the charge voltage VA is more rapidly increased because the output voltage Vo is high. For example, when the output voltage Vo is kept near its target value at the time of detecting an overcurrent, the charge voltage VA exceeds the threshold voltage VB and the mask period expiration signal SY40 rises to a high level at the time te1 immediately after the time t61 (before the time te2), as illustrated in FIG. 18. As a result, in the RS flipflop Y20, the mask signal SY20 is reset to a high level in response to the rising edge of the mask period expiration signal SY40.

Thereafter, at the time te2, when the overcurrent protection signal SX rises to a high level, since the mask signal SY20 has a high level, the second mask signal SY50 that latches the mask signal SY20 also has a high level. Further, even after the time t62, the aforementioned operation is repeated basically unless the output voltage Vo is changed.

In this manner, in FIG. 18, once the mask signal SY20 falls to a low level at every generation of the pulse of the clock signal S0 but rises to a high level again before an overcurrent is detected (i.e., before the overcurrent protection signal SX rises to a high level). Thus, since the second mask signal SY50 is kept in a high level, the pulse skip number is "0". In other words, the same overcurrent protection operation as that of the existing case where a forcible stop and self-return (resume) of the switching operation are repeated at every switching period T is performed.

Further, even when the time te2 is immediately before the time t62, namely, even when a timing at which an overcurrent is detected is immediately before a timing at which a pulse of the clock signal S0 is generated at a next period, the aforementioned overcurrent protection operation is performed without any change. Thus, unlike the second embodiment (FIG. 10), it is possible to dispel a possibility that a pulse skip operation which is not to be performed originally may be performed unintentionally.

Figure 19:
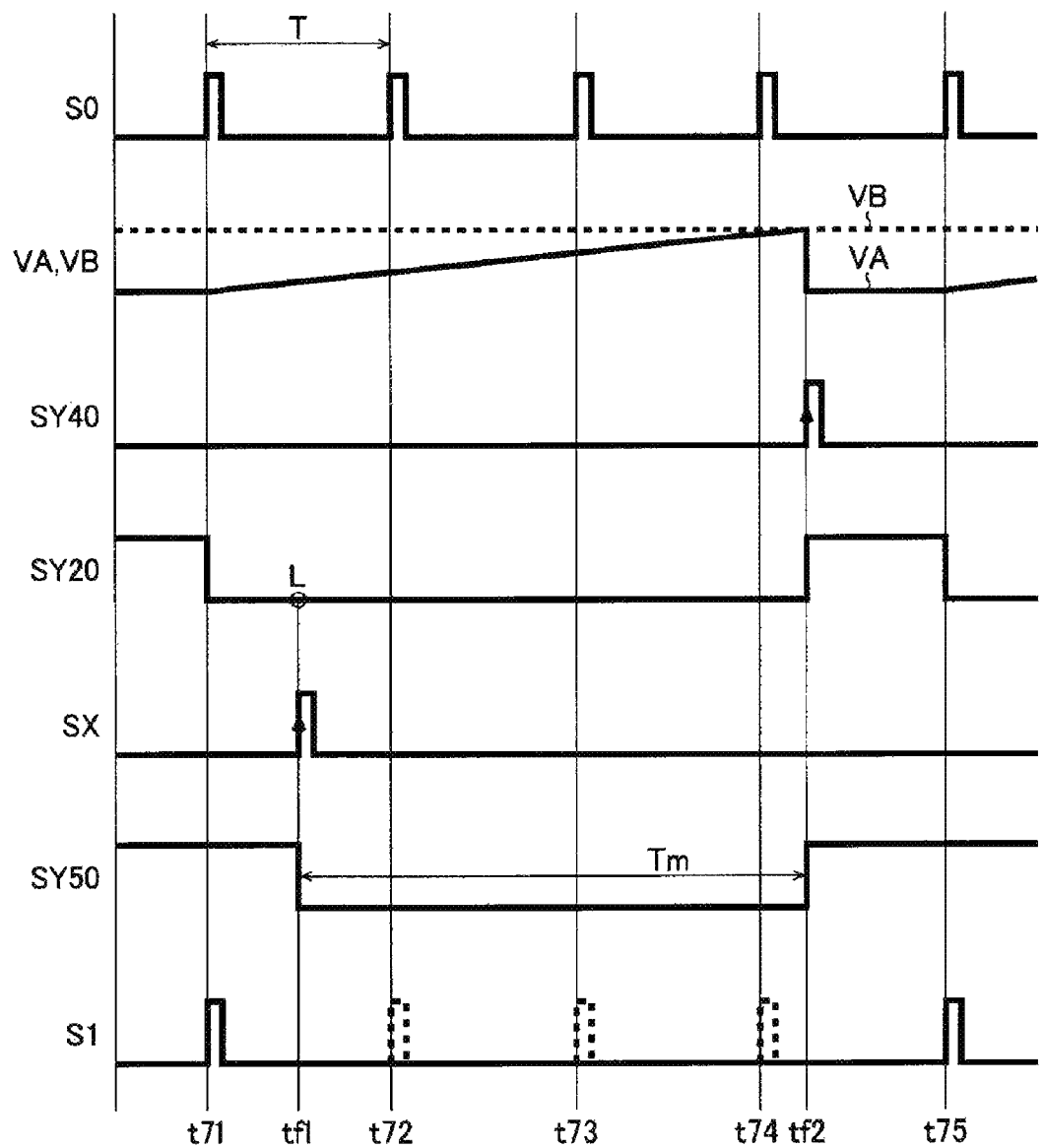
FIG. 19 is a timing chart illustrating a pulse skip operation in a low output time.

FIG. 19 is a timing chart illustrating a pulse skip operation (pulse skip number is "3") in a low output time. Similar to FIG. 18, the clock signal S0, the charge voltage VA and the threshold voltage VB, the mask period expiration signal SV40, the mask signal SY20, the overcurrent protection signal SX, the second mask signal SY50, and the ON signal S1 are illustrated in order from above. Further, times t71 to t75 indicate pulse generation timings of the clock signal S0, and an interval therebetween is a switching period T.

A case where the output transistor 111 is turned on at the time t71 and the overcurrent protection signal SX subsequently rises to a high level (i.e., a case where an overcurrent is detected) at the time tf1 is now considered. In this case, at the time t71, the mask signal SY20 is set to a low level in response to the rising edge of the mask signal SY20.

At this time, in the timer part Y40, the charge/discharge switch Y43 is turned off and the charge voltage VA starts to be increased. Also, the charge voltage VA is more gently increased because the output voltage Vo is low. For example, when the output voltage Vo is lowered from its target value at the time of detecting an overcurrent, the charge voltage VA does not exceed the threshold voltage VB even when the time tf1 at which the overcurrent protection signal SX rises to a high level arrives, as illustrated in FIG. 19. Thus, the mask period expiration signal SV40 does not rise to a high level and the mask signal SY20 is kept in a low level.

Thus, at the time tf1, when the overcurrent protection signal SX rises to a high level, since the mask signal SY20 has a low level, the second mask signal SY50 that latches the mask signal SY20 also has a low level. Thus, after the time tf1, the ON signal S1 is fixed to a low level during a low level period (i.e., mask period Tm) of the second mask signal SY50.

Also thereafter, the charge voltage VA continues to be gently increased and finally exceeds the threshold voltage VB at the time tf2 (later than time t74 and earlier than the time t75). As a result, since the mask period expiration signal SY40 rises to a high level, both the mask signal SY20 and the second mask signal SY50 are reset to a high level. Thus, after the time tf2, the process is returned to a state where the clock signal S0 is through-output as the ON signal S1.

Through the series of pulse skip operations, three pulses of the clock signal S0 are skipped during the mask period Tm from the time tf1 to the time tf2. Further, when the output voltage Vo is further increased, the charge current Ic may be further increased and the mask period Tm may be shortened. Thus, the pulse skip number may be set to a value smaller than "3". Conversely, when the output voltage Vo is further lowered, the charge current Ic may be further decreased and the mask period Tm may be lengthened. Thus, the pulse skip number may be set to a value greater than "3", which is not different from the aforementioned second embodiment.

<Electronic Devices>

Figure 20:
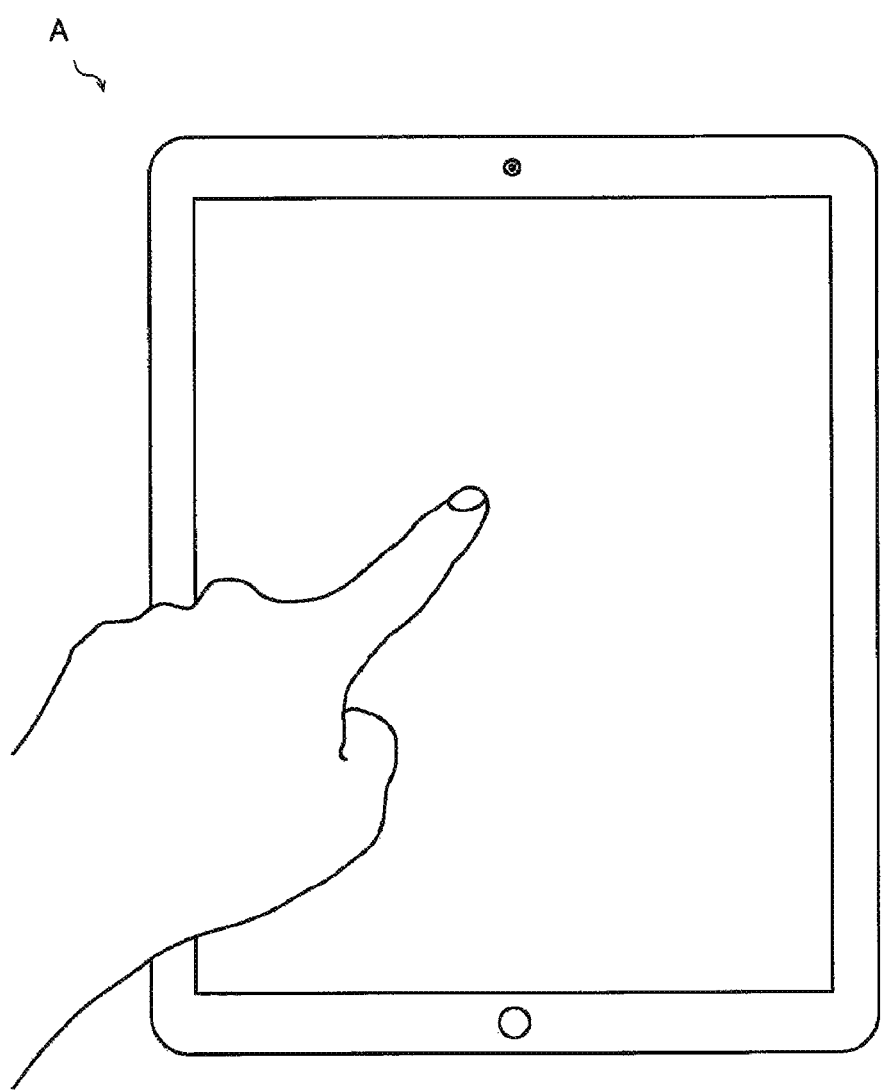
FIG. 20 is a view illustrating an appearance of a tablet terminal.

FIG. 20 is a view illustrating an appearance of a tablet terminal. A tablet terminal A is an example of an electronic device on which the switching power supply device 100 described above is mounted. However, the target on which the switching power supply device 100 is mounted is not limited thereto, but it may also be appropriately mounted on any other electronic device.

Other Embodiments

Further, various technical features described herein may be differently modified, in addition to the aforementioned embodiments, without departing from the spirit of the present disclosure. That is, the aforementioned embodiments are merely illustrative for all the purposes and should not be understood to be limiting. The technical scope of the present disclosure is presented by the accompanying claims, rather than the description of the embodiments, and thus intended to include all modifications that are within the accompanying claims and their equivalents.

The present disclosure described herein can be utilized in all the switching power supply devices (for example, a power supply device for CPU having a high switching frequency).

According to some embodiments of the present disclosure in, it is possible to provide a switching power supply device capable of enhancing a pulse-by-pulse type overcurrent protection function.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A switching power supply device, comprising:
a switching output circuit configured to generate an output voltage from an input voltage;
an oscillation circuit configured to generate a clock signal;
a control circuit configured to control driving of the switching output circuit in synchronization with the clock signal;
a pulse-by-pulse type overcurrent protection circuit configured to detect an overcurrent flowing through the switching output circuit to generate an overcurrent protection signal for forcibly stopping a switching operation of the switching output circuit; and
a pulse skip circuit configured to perform a pulse skip operation of the clock signal in response to the overcurrent protection signal, the pulse skip circuit including:
a timer part configured to start a counting operation in response to the overcurrent protection signal to generate a mask period expiration signal;
an RS flipflop configured to generate a mask signal set to a first logic level in response to the overcurrent protection signal and reset to a second logic level in response to the mask period expiration signal; and
a logic gate configured to block the clock signal over a mask period during which the mask signal is set to the first logic level,
wherein the timer part is configured to extend the mask period as the output voltage is lowered.

2. The device of claim 1, wherein the timer part comprises:
a current source configured to generate a charge current;
a capacitor charged by the charge current;
a charge/discharge switch configured to conduct and block current between both ends of the capacitor in response to the mask signal;
a voltage source configured to generate a threshold voltage; and
a comparator configured to compare a charge voltage of the capacitor with the threshold voltage to generate an expiration timing signal.

3. The device of claim 2, wherein the current source is configured to decrease the charge current as the output voltage is lowered.

4. The device of claim 2, wherein the voltage source is configured to increase the threshold voltage as the output voltage is lowered.

5. An electronic device comprising the switching power supply device of claim 1.

* * * * *